United States Patent
Zhang et al.

(10) Patent No.: US 9,184,218 B2
(45) Date of Patent: Nov. 10, 2015

(54) SEMICONDUCTOR MEMORY DEVICE HAVING THREE-DIMENSIONAL CROSS POINT ARRAY

(71) Applicant: SAMSUNG ELECTRONICS CO., LTD., Suwon-Si, Gyeonggi (KR)

(72) Inventors: Lijie Zhang, Suwon-Si (KR); Young-Bae Kim, Seoul (KR); Youn-Seon Kang, Yongin-Si (KR); In-Gyu Baek, Seoul (KR); Masayuki Terai, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/506,005

(22) Filed: Oct. 3, 2014

(65) Prior Publication Data

US 2015/0102282 A1    Apr. 16, 2015

(30) Foreign Application Priority Data

Oct. 14, 2013    (KR) .................. 10-2013-0122189

(51) Int. Cl.
*H01L 27/24* (2006.01)
*H01L 45/00* (2006.01)

(52) U.S. Cl.
CPC .......... *H01L 27/249* (2013.01); *H01L 27/2454* (2013.01); *H01L 45/04* (2013.01); *H01L 45/1226* (2013.01); *H01L 45/146* (2013.01)

(58) Field of Classification Search
CPC .... H01L 27/2481; H01L 27/249; H01L 45/04
See application file for complete search history.

(56) References Cited

U.S. PATENT DOCUMENTS

| | | | |
|---|---|---|---|
| 8,289,763 | B2 | 10/2012 | Liu |
| 2003/0203585 | A1 | 10/2003 | Hsu |
| 2005/0111263 | A1 | 5/2005 | Rinerson et al. |
| 2011/0199813 | A1 | 8/2011 | Yoo et al. |
| 2011/0199814 | A1 | 8/2011 | Maede |
| 2012/0020143 | A1 | 1/2012 | Lambertson et al. |
| 2012/0147650 | A1 | 6/2012 | Samachisa et al. |
| 2012/0286226 | A1 | 11/2012 | Seong et al. |
| 2012/0305877 | A1 | 12/2012 | Ju et al. |
| 2013/0009122 | A1 | 1/2013 | Park et al. |
| 2015/0102282 | A1* | 4/2015 | Zhang .................. H01L 27/249 257/5 |

FOREIGN PATENT DOCUMENTS

KR    10-2012-0097634    9/2012

* cited by examiner

*Primary Examiner* — Mark Prenty
(74) *Attorney, Agent, or Firm* — Volentine & Whitt, PLLC

(57) ABSTRACT

A semiconductor memory device includes pillars extending upright on a substrate in a direction perpendicular to the substrate, a stack disposed on the substrate and constituted by a first interlayer insulating layer, a first conductive layer, a second interlayer insulating layer, and a second conductive layer, a variable resistance layer interposed between the pillars and the first conductive layer, and an insulating layer interposed between the first pillars and the second conductive layer.

20 Claims, 36 Drawing Sheets

A-A'

A-A'

A-A'

A-A'

A-A'

A-A'

A-A'

A-A'

A-A'

B-B'

B-B'

B-B'

B-B'

B-B'

B-B'

B-B'

B-B'

SEMICONDUCTOR MEMORY DEVICE HAVING THREE-DIMENSIONAL CROSS POINT ARRAY

PRIORITY STATEMENT

This application claims the benefit of Korean Patent Application No. 10-2013-0122189, filed on Oct. 14, 2013, in the Korean Intellectual Property Office, the disclosure of which is incorporated by reference herein in its entirety.

BACKGROUND

The inventive concept relates to a semiconductor memory device. More particularly, the inventive concept relates to a semiconductor memory device having a three-dimensional (3D) cross-point array that includes vertically stacked variable resistance memory cells.

A resistance random access memory (RRAM) is a memory device using a resistance varying property of a transition metal oxide, that is, a property in which the resistance of the material differs according to a state of the material. In the case of an RRAM, research has been actively conducted into a 3D cross-point array structure to meet the demand for a highly integrated memory device. The 3D cross-point array structure is a structure in which a plurality of upper electrodes and a plurality of lower electrodes are formed to cross each other and memory cells are disposed at cross points. The 3D cross-point array structure is advantageous in storing and reading data because random access is possible; however, a current path is formed between a memory cell that has been accessed and adjacent memory cells, and thus, a large leakage current may occur. Thus, electric characteristics may be degraded and it may be difficult to form a highly integrated memory device.

SUMMARY

The inventive concept provides a semiconductor memory device having a three-dimensional (3D) cross-point array structure, which is capable of minimizing leakage current, offering improved electrical characteristics, and being highly integrated.

According to an aspect of the inventive concept, there is provided a semiconductor memory device comprising a substrate, first pillars extending upright on the substrate in a direction perpendicular to a major surface of the substrate, a first interlayer insulating layer pattern, a first conductive layer pattern, a second interlayer insulating layer pattern, and a second conductive layer pattern disposed on the substrate in a stack and which stack extends vertically alongside the first pillars, a variable resistance layer interposed between the first pillars and the first conductive layer pattern, and an insulating layer interposed between the first pillars and the second conductive layer pattern.

According to another aspect of the inventive concept, there is provided a semiconductor memory device comprising a substrate, pillars extending upright on the substrate in a direction perpendicular to a major surface of the substrate, an insulating layer extending along the sides of the pillars, a semiconductor layer on the insulating layer, an interlayer insulating layer pattern and a first conductive layer pattern disposed in a stack on the substrate and which stack extends vertically alongside the pillars, a second conductive layer pattern interposed between the pillars and the first conductive layer pattern, and a variable resistance layer interposed between the first conductive layer pattern and the second conductive layer pattern.

According to still another aspect of the inventive concept, there is provided a semiconductor memory device comprising a first word line, a first local bit line including a first transistor and a second transistor that are connected to each other in series, a first virtual bit line connecting gates of the first transistor and the second transistor, and a first variable resistance memory cell connected in the device between the first word line a common node where the first transistor and the second transistor are connected to each other in series.

BRIEF DESCRIPTION OF THE DRAWINGS

The inventive concept will be more clearly understood from the following detailed description of preferred embodiments thereof taken in conjunction with the accompanying drawings in which.

DETAILED DESCRIPTION OF THE PREFERRED EMBODIMENTS

Figure 1:
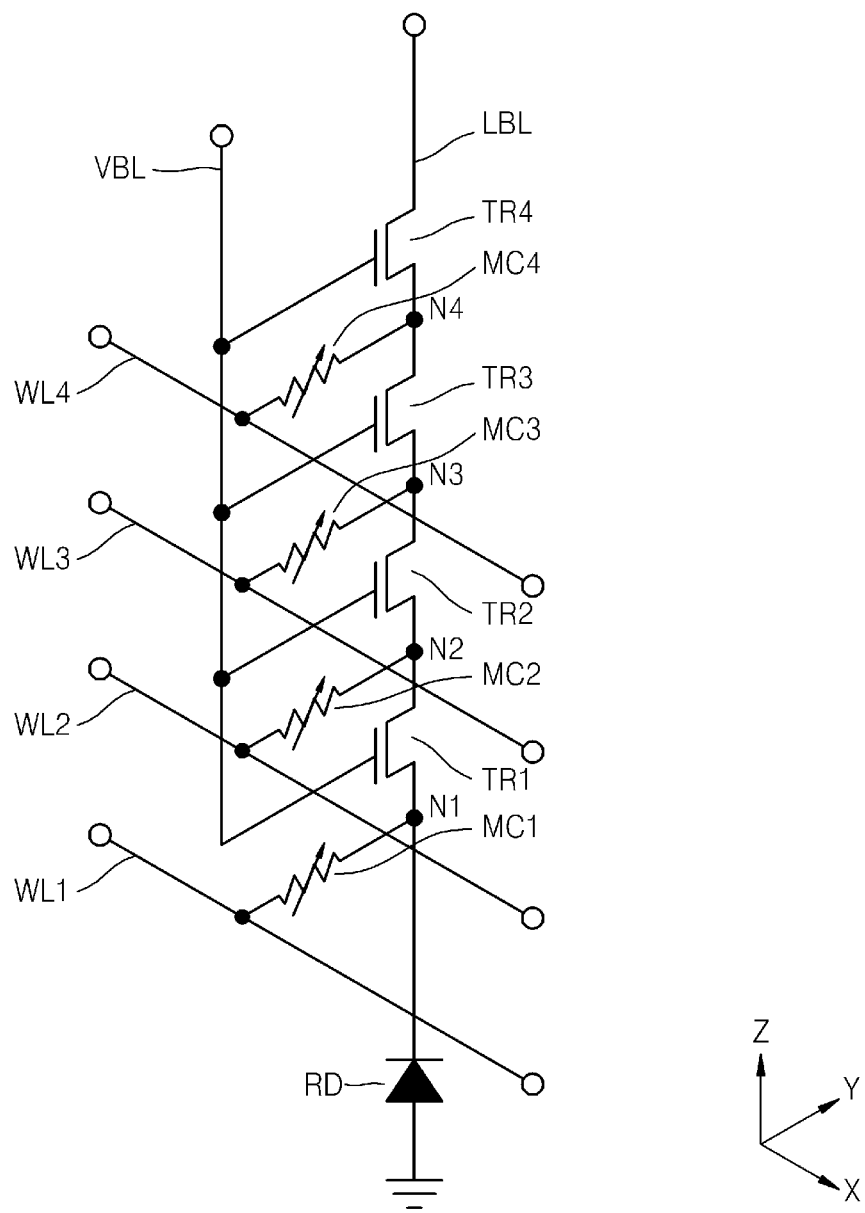
FIG. 1 is an equivalent circuit diagram of main components of an embodiment of a semiconductor memory device according to the present inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will be understood that although the terms first, second, third etc. are used herein to describe various layers, patterns, etc., these elements and/or patterns, etc. are not limited by these terms. These terms are only used to distinguish one element, pattern, etc. from another.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. Likewise, when an element or layer is referred to as being interposed "between" other elements or layers, it can be directly between the other elements or layers or intervening elements or layers may be present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "layer pattern" may a times be used to refer to one layer in a series of similar layers (e.g., vertically spaced layers) that have been formed by some patterning process and/or may refer collectively to the entire series of layers formed by the patterning process. Also, when a feature is described as "extending" in a particular direction or directions, it will be understood that those directions correspond to the major dimensions of the feature such as its length or height as the context and Cartesian coordinate system employed in select ones of the figures will make clear.

Now, an equivalent circuit provided by major components of a semiconductor memory device according to the present inventive concept will be described in detail with reference to FIG. 1. In this respect, FIG. 1 shows one local bit line LBL and one virtual bit line VBL for convenience of illustration. In addition, FIG. 1 shows four memory cells MC1 through MC4. However, embodiments of the present inventive concept are not limited thereto, and more memory cells may be provided depending on the desired capacity of the semiconductor memory device. In this case, the number of transistors and word lines configuring the local bit line LBL may increase according to the number of additional memory cells.

Referring to FIG. 1, in addition to the aforementioned local bit line LBL and virtual bit line VBL and memory cells MC1 through MC4, the semiconductor memory device may include word lines WL1 through WL4.

The local bit line LBL may act as a lower electrode for supplying current or a voltage to the memory cells MC1 through MC4. The local bit line LBL may have a vertical structure extending in a direction perpendicular (z direction) to a main surface (x-y plane) of a substrate (not shown). The local bit line LBL may include first through fourth transistors TR1 through TR4 that are sequentially connected to each other in series on the substrate. The first transistor TR1 of the local bit line LBL may be connected to a reverse junction diode RD formed on the substrate. On the local bit line LBL, an N-type region of the reverse junction diode RD and a source of the first transistor TR1 form a common node N1, a drain of the first transistor TR1 and a source of the second transistor TR2 form a common node N2, a drain of the second transistor TR2 and a source of the third transistor TR3 form a common node N3, and a drain of the third transistor TR3 and a source of the fourth transistor TR4 form a common node N4.

The virtual bit line VBL controls the turning on/off of the first through fourth transistors TR1 through TR4 in order to control a current flow via the local bit line LBL. The virtual bit line VBL extends in the z direction, and may commonly connect gates of the first through fourth transistors TR1 through TR4 of the local bit line LBL to each other. In addition, the virtual bit line VBL and the local bit line LBL are shown as lying in the y-z plane in FIG. 1 for convenience of illustration; however, locations of the virtual bit line VBL and the local bit line LBL are not limited thereto.

The word lines WL1 through WL4 may act as upper electrodes of the memory cells MC1 through MC4, respectively. The word lines WL1 through WL4 are separated from the local bit line LBL and the virtual bit line VBL, and may extend in the x direction in parallel with each other. The word lines WL1 through WL4 may be spaced predetermined distances in the y direction from the common nodes N1 through N4, respectively.

The memory cells MC1 through MC4 that store data may be located at cross points between the word lines WL1 through WL4 and the local bit line LBL. In particular, the memory cell MC1 may be located between the word line WL1 and the common node N1, the memory cell MC2 may be located between the word line WL2 and the common node N2, the memory cell MC3 may be located between the word line WL3 and the common node N3, and the memory cell MC4 may be located between the word line WL4 and the common node N4. Each of the memory cells MC1 through MC4 may be a variable resistance memory cell having a characteristic that its resistance varies depending on of the magnitude of applied current or voltage.

The present embodiment of a semiconductor memory device, as described above, has lower electrode lines including the local bit line LBL consisting of the first through fourth transistors TR1 through TR4 and the virtual bit line VBL commonly connecting the gates of the first through fourth transistors TR1 through TR4. Accordingly, a leakage current path to adjacent memory cells may be blocked while the semiconductor memory device is being driven unlike a conventional 3D cross-point array in which memory cells are arranged at cross points between upper electrode lines and lower electrode lines that are single wires. This will be described in more detail below with reference to FIG. 2.

Figure 2:
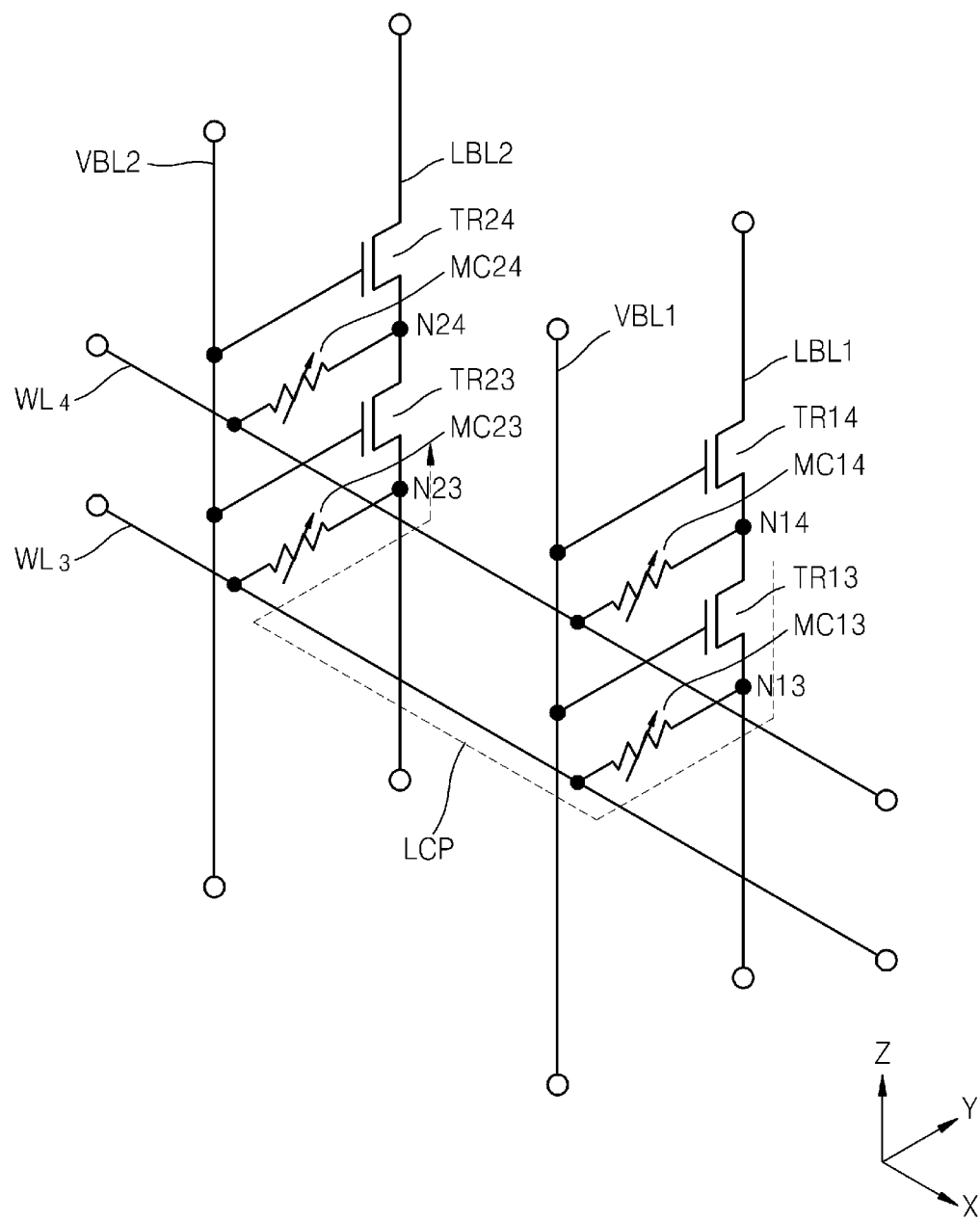
FIG. 2 is a diagram illustrating a principle of blocking a leakage current path in an embodiment of the semiconductor memory device according to the present inventive concept.

Referring to FIG. 2, a local bit line LBL1 and a local bit line LBL2 are separated from each other in an x direction on a substrate (not shown) and extend along a z direction. A virtual bit line VBL1, connected to gates of transistors TR13 and TR14 forming the local bit line LBL1, and a virtual bit line VBL2, connected to gates of transistors TR23 and TR24 forming the local bit line LBL2, are separated from each other in the x direction and extend in the z direction. A word line $WL_3$ and a word line $WL_4$ extend in the x direction in parallel with each other at different levels above the substrate. Memory cells MC13 and MC23 are respectively arranged between the word line $WL_3$ and common nodes N13 and N23, and memory cells MC14 and MC24 are respectively arranged between the word line $WL_4$ and common nodes N14 and N24.

When data is read from the memory cell MC14, a predetermined reading voltage is applied to the word line $WL_4$ and a driving voltage is applied to the virtual bit line VBL1 to make the local bit line LBL1 conduct, and thus, the data may be read from the memory cell MC14.

Here, a leakage current path LCP may be formed through the local bit line LBL1, the word line $WL_3$, the local bit line LBL2, and the memory cell MC24. However, when a predetermined voltage having a level that is lower than a reading voltage is applied to the word line $WL_3$ that is adjacent to the word line $WL_4$, the other word lines (not shown) except for the word line $WL_3$ are floated, and a voltage that is less than a threshold voltage of the transistors TR23 and TR24 configuring the local bit line LBL2 is applied to the virtual bit line VBL2 to turn the transistors TR23 and TR24 of the local bit line LBL2 off, the leakage current path LCP may be blocked. Accordingly, generation of leakage current toward the adjacent memory cell MC24 may be prevented when reading the memory cell MC14.

Likewise, when programming the memory cell MC14 to a set status, that is, a low resistive state, or a reset status, that is, a high resistive state, the transistors TR23 and TR24 of the local bit line LBL2 are turned off, and thus, the leakage current path LCP may be blocked, and accordingly, generation of the leakage current toward the adjacent memory cell MC24 may be prevented.

As described above, according to the semiconductor memory device, the leakage current path may be effectively blocked by controlling the transistors configuring the local bit line, and thus, the leakage current may be greatly reduced. In addition, by reducing the leakage current, power consumption may be reduced, a sensing margin may be increased, and reliability may be improved. Accordingly, electrical characteristics of the semiconductor memory device may be improved and a highly integrated semiconductor memory device may be manufactured.

An embodiment of a semiconductor memory device 10 according to of the present inventive concept will now be described in detail with reference to FIGS. 3A-3C.

Figure 3A:
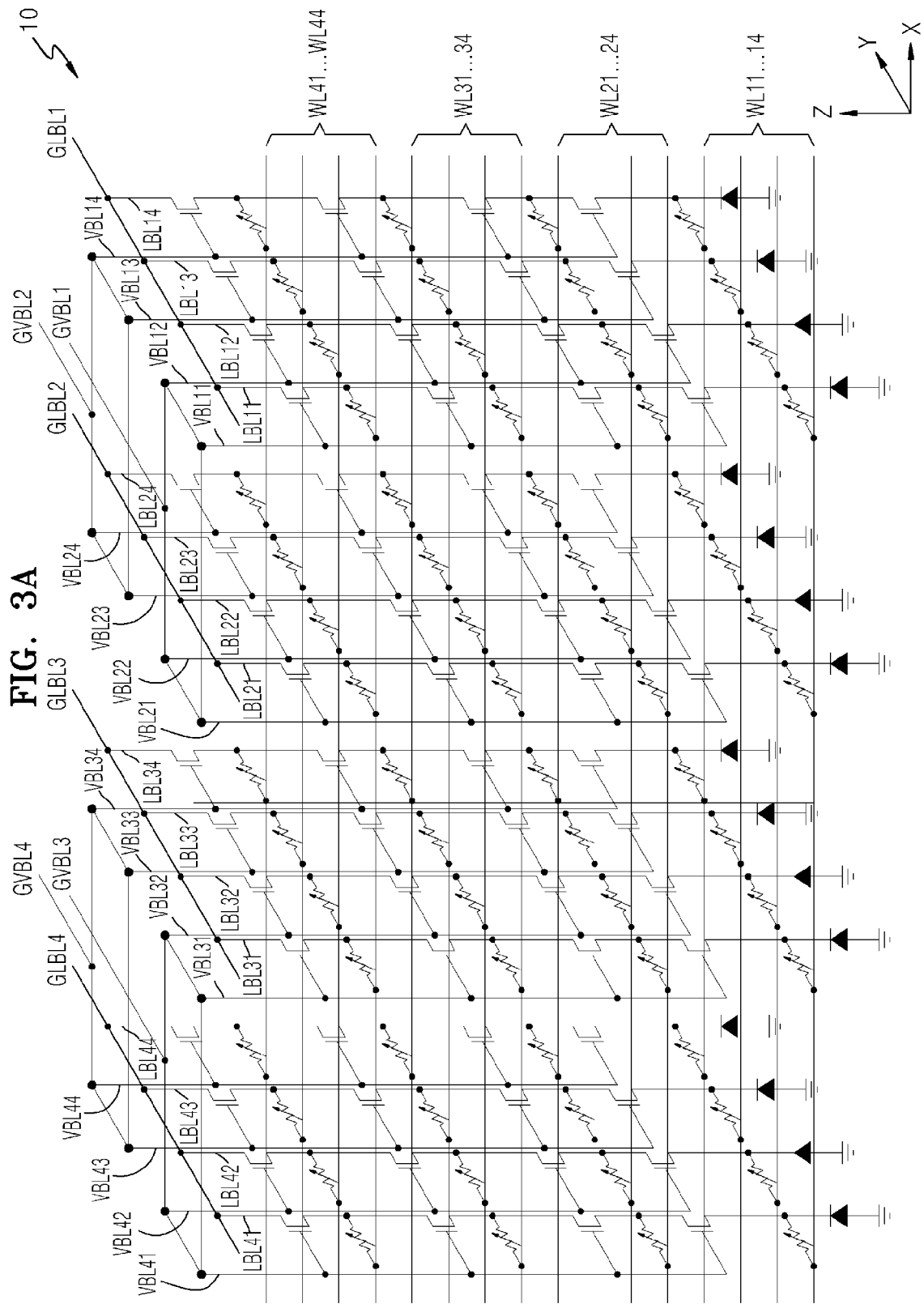
FIG. 3A is an equivalent circuit diagram of an embodiment of a semiconductor memory device according to the present inventive concept.

Referring to FIG. 3A, local bit lines LBL11 through LBL14 in the semiconductor memory device 10 are separately arranged on a substrate (not shown) in a y direction and may extend in a z direction. Local bit lines LBL21 through LBL44 may be arranged similarly to the local bit lines LBL11 through LBL14.

Lowermost transistors of the local bit lines LBL11 through LBL44 may be respectively connected to their corresponding reverse junction diodes formed on the substrate.

The local bit lines LBL11 through LBL14 may be commonly connected to a global local bit line GLBL1 extending along the y direction. That is, drains of uppermost transistors of the local bit lines LBL11 through LBL14 may be commonly connected to the global local bit line GLBL1. The local bit lines LBL21 through LBL24 may be commonly connected to a global local bit line GLBL2, and local bit lines LBL31 through LBL34 may be commonly connected to a global local bit line GLBL3. In addition, the local bit lines LBL41 through LBL44 may be commonly connected to a global local bit line GLBL4. As such, the local bit lines may be driven in groups via the global local bit lines.

Virtual bit lines VBL11 through VBL14 respectively corresponding to the local bit lines LBL11 through LBL14 may be separately arranged in the y direction and may extend along the z direction. Virtual bit lines VBL21 through VBL44 may be arranged similarly to the virtual bit lines VBL11 through VBL14.

The virtual bit lines VBL11, VBL12, VBL21, and VBL22 may be commonly connected to a global virtual bit line GVBL1 extending in the y direction. Likewise, virtual bit lines VBL13, VBL14, VBL23, and VBL24 may be commonly connected to a global virtual bit line GVBL2, virtual bit lines VBL31, VBL32, VBL41, and VBL42 may be commonly connected to a global virtual bit line GVBL3, and virtual bit lines VBL33, VBL34, VBL43, and VBL44 may be commonly connected to a global virtual bit line GVBL4.

In FIG. 3A, four virtual bit lines are shown as being connected in common to a respective global virtual bit line for each of a plurality of groups of the virtual bit lines. However, as shown in FIGS. 3B and 3C, in actuality, one virtual bit line may be commonly connected to four neighboring local bit lines, and is connected to the global virtual bit line, as will be described later.

Word lines WL11 through WL14 are separately arranged in the y direction and may extend along the x direction. The word lines WL21 through WL44 may be arranged similarly to the word lines WL11 through WL14. The word lines WL11 through WL14, the word lines WL21 through WL24, the word lines WL31 through WL34, and the word lines WL41 through WL44 may be grouped and the groups may be vertically aligned.

At cross points between the word lines WL11, WL21, WL31, and WL41 and their corresponding local bit lines LBL11, LBL21, LBL31, and LBL41, variable resistance memory cells are respectively arranged. Likewise, variable resistance memory cells are arranged respectively at cross points between the word lines WL12 through WL44 and their corresponding local bit lines LBL12 through LBL44.

Figure 3B:
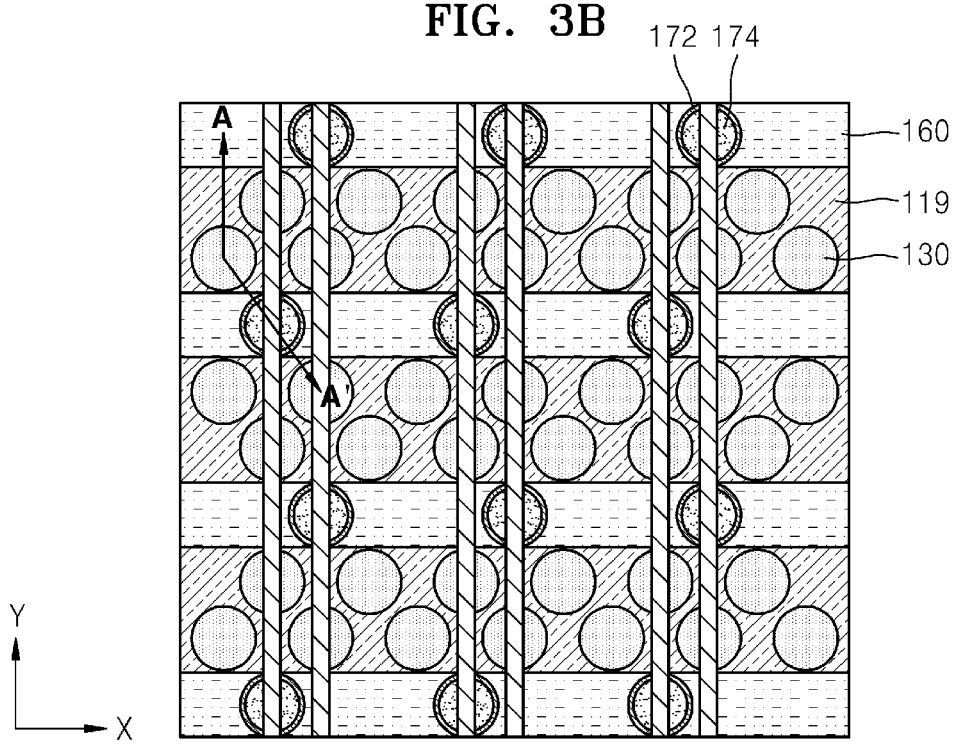
FIG. 3B is a plan view of layouts of some components shown in FIG. 3A.
Figure 3C:
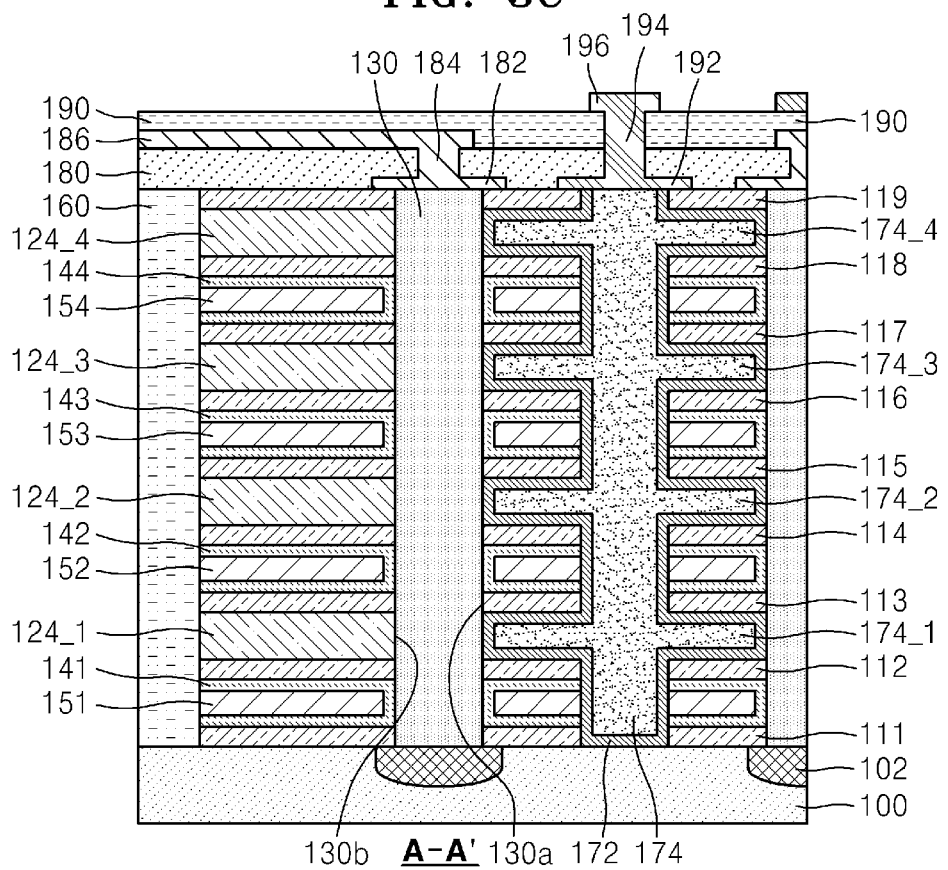
FIG. 3C is a cross-sectional view of the semiconductor memory device taken along line A-A' of FIG. 3B.

Referring to FIGS. 3B and 3C, a main surface of a substrate 100 may lie in an x-y plane. Impurity regions 102 may be formed in the substrate 100. The impurity regions 102 are formed as islands and may be arranged in zig-zags along the x direction so as to correspond to arrangements of first pillars 130 that are formed above the impurity regions 102.

The impurity regions 102 may form PN junctions with other regions of the substrate 100. For example, if the substrate 100 is doped with p-type impurities, the impurity regions 102 may be doped with n-type impurities to form the PN junctions with the substrate 100. According to other examples of this embodiment of the present inventive concept, the impurity regions 102 include an n-type impurity region (not shown) that is adjacent to the main surface of the substrate 100 and located at a center thereof, and p-type impurity regions (not shown) surrounding the n-type impurity region, and thus forming PN junctions themselves.

In addition, although not shown in FIGS. 3B and 3C, a buffer layer such as a silicon oxide layer may be further formed on the main surface of the substrate 100.

The first pillars 130 that extend in a direction perpendicular to the x and y directions, that is, the z direction, may be respectively formed on the impurity regions 102 on the main surface of the substrate 100. The first pillars 130 may be formed of a semiconductor material such as single-crystalline silicon, poly-silicon, or germanium. The semiconductor material may include p-type or n-type impurities. The first pillars 130 may correspond to channels of the transistors configuring the local bit lines and lower electrodes of the variable resistance memory cells shown in FIG. 3A.

Each of the first pillars 130 may be formed as a cylinder having a circular cross section with respect to the z direction (in the x-y plane perpendicular to the z direction); however, the shape of the pillar is not limited thereto. The first pillar 130 may be formed as a pillar having a polygonal cross section with respect to the z direction.

The first pillars 130 may be divided by insulating regions 160 that extend in the x and z directions on the main surface of the substrate 100 and are formed as lines. For example, the first pillars 130 may be arranged in two columns in the x direction between every two neighboring insulating regions 160. The first pillars 130 arranged in two columns between the two neighboring insulating regions 160 may be offset in the y direction and may be arranged in zig-zags. The first pillars 130 that are arranged divided from one another by an insulating region 160 may be arranged symmetrically with each other about the insulating region 160; however, the present inventive concept is not limited thereto. That is, the first pillars 130 that may be arranged asymmetrically with each other about the insulating region 160.

Second pillars 174 may be formed on the main surface of the substrate 100 through the insulating regions 160 and extending in the z direction. The second pillars 174 may be formed of a conductive material, for example, polysilicon or a metal material such as TiN, W, or Pt. The second pillars 174 may correspond to the virtual bit lines shown in FIG. 3A.

Each of the second pillars 174 may have a body and portions protruding from a side surface of the body in the x direction (or the y direction). The protrusions may be second conductive layer patterns 174_1 through 174_4 that will be described later. That is, each of the second pillars 174 may be realized as a virtual bit line that is commonly connected to four adjacent first pillars 130 via the second conductive layer patterns 174_1 through 174_4.

The body of the second pillar 174 may have a circular cross section with respect to the z direction. However, the present inventive concept is not limited thereto, that is, the body of the second pillar 174 may have a polygonal cross section with respect to the z direction.

The second pillars 174 may be formed as columns in the x direction within the insulating regions 160. The second pillars 174 may be arranged consistently without being offset in the y direction; however, the inventive concept is not limited to such an arrangement.

An interlayer insulating layer pattern, a first conductive layer pattern corresponding to the word lines shown in FIG. 3A, an interlayer insulating layer pattern, and a second conductive layer pattern corresponding to gates of the transistors shown in FIG. 3A may be stacked alternately and repeatedly in the z direction, between each first pillar 130 and the second pillar 174 adjacent to the first pillar 130. That is, the interlayer insulating layer pattern, the first conductive layer pattern, the interlayer insulating layer pattern, and the second conductive layer pattern may be stacked alternately and repeatedly along a first side surface 130a of the first pillar 130 extending toward the second pillar 174 formed in the insulating layer 160 that is adjacent to the first pillar 130.

In particular, a first conductive layer pattern 151 may be formed on an interlayer insulating layer pattern 111. An interlayer insulating layer pattern 112 may be formed on the first conductive layer pattern 151. The second conductive layer pattern 174_1 may be formed on the interlayer insulating layer pattern 112. An interlayer insulating layer pattern 113 may be formed on the second conductive layer pattern 174_1. A first conductive layer pattern 152 may be formed on the interlayer insulating layer pattern 113. An interlayer insulating layer pattern 114 may be formed on the first conductive layer pattern 152. The second conductive layer pattern 174_2 may be formed on the interlayer insulating layer pattern 114. An interlayer insulating layer pattern 115 may be formed on the second conductive layer pattern 174_2. A first conductive layer pattern 153 may be formed on the interlayer insulating layer pattern 115. An interlayer insulating layer pattern 116 may be formed on the first conductive layer pattern 153. The second conductive layer pattern 174_3 may be formed on the interlayer insulating layer pattern 116. An interlayer insulating layer pattern 117 may be formed on the second conductive layer pattern 174_3. A first conductive layer pattern 154 may be formed on the interlayer insulating layer pattern 117. An interlayer insulating layer pattern 118 may be formed on the first conductive layer pattern 154. The second conductive layer pattern 174_4 may be formed on the interlayer insulating layer pattern 118. An interlayer insulating layer pattern 119 may be formed on the second conductive layer pattern 174_4. Accordingly, an interlayer insulating layer pattern, namely, pattern 119 is the uppermost of the alternating conductive layer and interlayer insulating layer patterns, and an upper surface of the interlayer insulating layer pattern 119 may be coplanar with an upper surface of the first pillar 130.

Variable resistance layers 141 through 144 may be disposed between the first side surface 130a of the first pillar 130 and the first conductive layer patterns 151 through 154. That is, the variable resistance layers 141 through 144 may be formed on side surfaces of the first conductive layer patterns 151 through 154 that are adjacent to the first side surface 130a of the first pillar 130. Each of the variable resistance layers 141 through 144 may extend to upper and lower surfaces of a corresponding first conductive layer pattern 151, 152, 153, or 154. That is, each of the variable resistance layers 141 through 144 may respectively surround the corresponding first conductive layer pattern 151, 152, 153, or 154. The thickness of the portion of each of the variable resistance layers 141 through 144 on the side surface of the first conductive layer pattern 151, 152, 153, or 154 may differ from that of the portion on the upper surface and/or the lower surface of the first conductive layer pattern 151, 152, 153, or 154.

The variable resistance layers 141 through 144 may correspond to the memory cells shown in FIG. 3A. The variable resistance layers 141 through 144 may include, for example, transition metal oxide (TMO). The TMO may be at least one of HafOx, TiOx, TaOx, ZnO, $Ti_2O$, $Nb_2O_5$, $ZrO_2$, and NiO. In addition, the variable resistance layers 141 through 144 may include a phase change material or a magnetic tunnel junction.

Although FIGS. 3B and 3C show that the variable resistance layers 141 through 144 are single layers, the present inventive concept is not so limited. That is, each of the variable resistance layers 141 through 144 may be formed as a plurality of layers.

An insulating layer 172 may be disposed between a side surface of the second pillar 174 extending toward the adjacent first pillar 130 and side surfaces of the first conductive layer patterns 151 through 154.

According to an aspect of the present inventive concept, residual material of the insulating regions 160 may be disposed between the side surface of the second pillar 174 and the side surfaces of the first conductive layer patterns 151 through 154. This is because a depressed portion may be formed in the side portion of the first conductive layer patterns 151 through 154, which faces the side surface of the second pillar 174, due to excessive etching while forming the first conductive layer patterns 151 through 154.

The insulating layer 172 may correspond to a gate insulating layer forming the gate of the transistor shown in FIG. 3A. The insulating layer 172 may be at least one of a silicon oxide layer, a silicon nitride layer, a silicon oxynitride layer, an oxide/nitride/oxide (ONO), and a high-k dielectric film having a dielectric constant that is greater than that of silicon oxide.

The insulating layer 172 may be disposed between the first side surface 130a of the first pillar 130 and the second conductive layer patterns 174_1 through 174_4. The insulating layer 172 may be formed on side surfaces of the second conductive layer patterns 174_1 through 174_4. The insulating layer 172 may extend to upper and lower surfaces of a corresponding second conductive layer pattern 174_1, 174_2, 174_3, or 174_4. That is, the insulating layer 172 may surround the corresponding second conductive layer pattern 174_1, 174_2, 174_3, or 174_4.

The thickness of insulating layer 172 on the side surface of the second conductive layer pattern 174_1, 174_2, 174_3, or 174_4 and may be different from its thickness on the upper surface and/or the lower surface of the second conductive layer pattern 174_1, 174_2, 174_3, or 174_4.

An interlayer insulating layer pattern, a first conductive layer pattern, an interlayer insulating layer pattern, and a residual sacrificial layer pattern may be alternately and repeatedly stacked along a surface opposite to the first side surface 130a of the first pillar 130, that is, a second side surface 130b of the first pillar 130, extending away from the second pillar 174. That is, unlike the first side surface 130a of the first pillar 130, the residual sacrificial layer pattern may be disposed between the interlayer insulating layer patterns. Residual sacrificial layer patterns 124_1 through 124_4 may be located at the same levels (the z direction) as those of the second conductive layer patterns 174_1 through 174_4.

More specifically, the first conductive layer pattern 151 may be formed on the interlayer insulating layer pattern 111. The interlayer insulating layer pattern 112 may be formed on the first conductive layer pattern 151. The residual sacrificial layer pattern 124_1 may be formed on the interlayer insulating layer pattern 112. The interlayer insulating layer pattern 113 may be formed on the residual sacrificial layer 124_1. The first conductive layer pattern 152 may be formed on the interlayer insulating layer pattern 113. The interlayer insulating layer pattern 114 may be formed on the first conductive layer pattern 152. The residual sacrificial layer pattern 124_2 may be formed on the interlayer insulating layer pattern 114. The interlayer insulating layer pattern 115 may be formed on the residual sacrificial layer pattern 124_2. The first conductive layer pattern 153 may be formed on the interlayer insulating layer pattern 115. The interlayer insulating layer pattern 116 may be formed on the first conductive layer pattern 153. The residual sacrificial layer pattern 124_3 may be formed on the interlayer insulating layer pattern 116. The interlayer insulating layer pattern 117 may be formed on the residual sacrificial layer pattern 124_3. The first conductive layer pattern 154 may be formed on the interlayer insulating layer pattern 117. The interlayer insulating layer pattern 118 may be formed on the first conductive layer pattern 154. The residual sacrificial layer pattern 124_4 may be formed on the interlayer insulating layer pattern 118. The interlayer insulating layer pattern 119 may be formed on the residual sacrificial layer pattern 124_4. Accordingly, an interlayer insulating layer pattern, namely, the interlayer insulating layer pattern 119 is the uppermost of these layer patterns, and may have an upper surface coplanar with the upper surface of the first pillar 130.

The variable resistance layers 141 through 144 may be disposed between the second side surface 130b of the first pillar 130 and the first conductive layer patterns 151 through 154. The variable resistance layers 141 through 144 may be formed respectively on the side surfaces of the corresponding first conductive layer patterns 151 through 154, which correspond to the first side surface 130a of the first pillar 130. The variable resistance layers 141 through 144 may extend to upper and lower surfaces of the corresponding first conductive layer patterns 151 through 154.

The second side surface 130b of the first pillar 130 and one of the side surfaces of the residual sacrificial layer patterns 124_1 through 124_4 may contact each other. That is, no material may exist between the second side surface 130b of the first pillar 130 and the residual sacrificial layers 124_1 through 124_4.

A respective contact pad 182 may be formed on an upper surface of each of the first pillars 130, and a respective contact pad 192 may be formed on an upper surface of each of the second pillars 174.

An insulating layer 180 between first wires may be formed to cover the contact pads 182, the contact pads 192, the uppermost interlayer insulating layer pattern 119, and the insulating regions 160. A first wiring layer 186 extending in the y direction (see FIG. 15A) may be formed on the insulating layer 180 between first wires. The first wiring layer 186 may be connected to the contact pads 182 via contact plugs 184 penetrating through the insulating layer 180 between first wires. The first wiring layer 186 may correspond to the global local bit line shown in FIG. 3A.

An insulating layer 190 between second wires may be formed to cover the first wiring layer 186. A second wiring layer 196 extending in the y direction may be formed on the insulating layer 190 between second wires. The second wiring layer 196 may be connected to the contact pads 192 via contact plugs 194 penetrating through the insulating layer 180 between first wires and the insulating layer 190 between second wires. The second wiring layer 196 may correspond to the global virtual bit line shown in FIG. 3A.

A method of manufacturing the semiconductor memory device 10, shown in FIGS. 3A through 3C, will now be described with reference to FIGS. 4A through 16B.

Figure 4A:
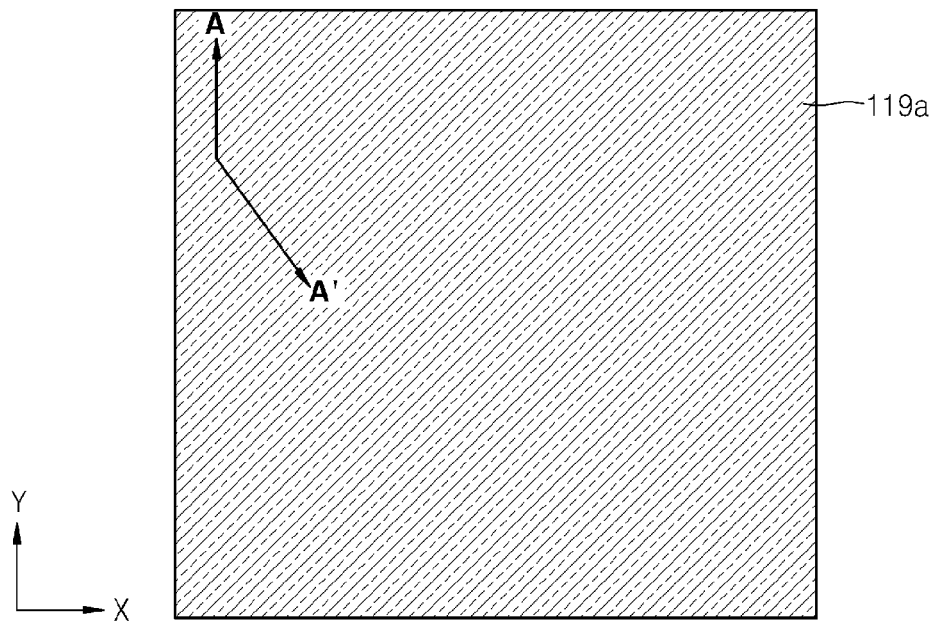
FIGS. 4A through 16B are diagrams illustrating a method of manufacturing the semiconductor memory device shown in FIGS. 3A through 3B according to a processing order.
Figure 4B:
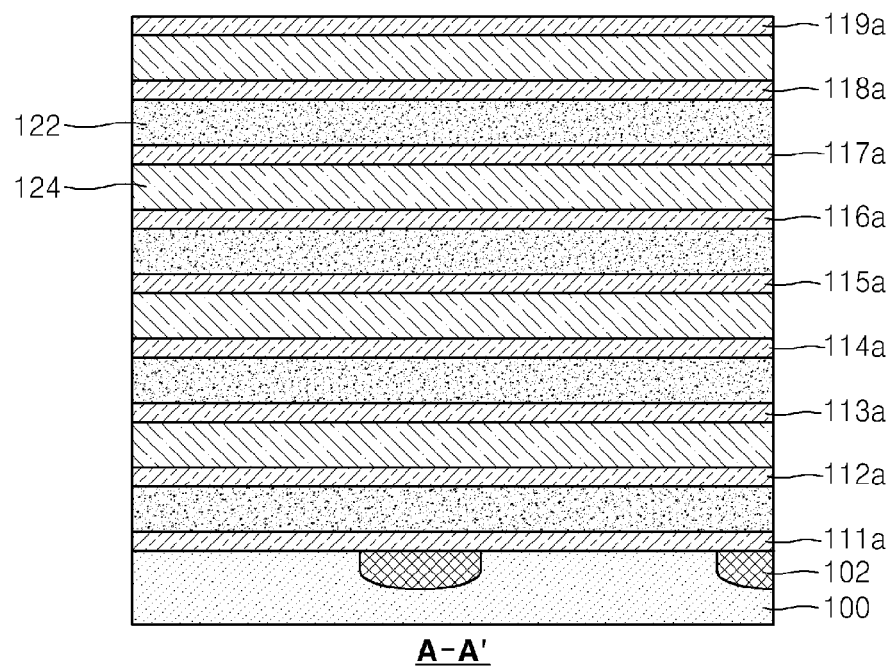

Referring to FIGS. 4A and 4B, interlayer insulating layers 111a through 119a, a first sacrificial layer 122, and a second sacrificial layer 124 are alternately and repeatedly stacked on the substrate 100, in which impurity regions 102 are formed. The interlayer insulating layers 111a through 119a and the first and second sacrificial layers 122 and 124 may be formed by a chemical vapor deposition method.

The substrate 100 may include a semiconductor material, for example, a group IV semiconductor, a group III-V semiconductor compound, or a group II-VI semiconductor oxide. Examples of substrates including the group IV are silicon, germanium, or silicon-germanium substrates. The substrate 100 may be a bulk wafer or an epitaxial layer.

The interlayer insulating layers 111a through 119a may be formed of material having an etch selectivity with respect to that of the material of the first and second sacrificial layers 122 and 124. For example, the interlayer insulating layers 111a through 119a may each be one of an oxide layer, a nitride layer, and an oxynitride layer and the first and second sacrificial layers 122 and 124 may each be another of an oxide layer, a nitride layer, and an oxynitride layer.

The interlayer insulating layers 111a through 119a may have thicknesses that are different from those of the first and second sacrificial layers 122 and 124, and the first and second sacrificial layers 122 and 124 may have the same thickness as each other. However, the present inventive concept is not limited thereto.

Figure 5A:
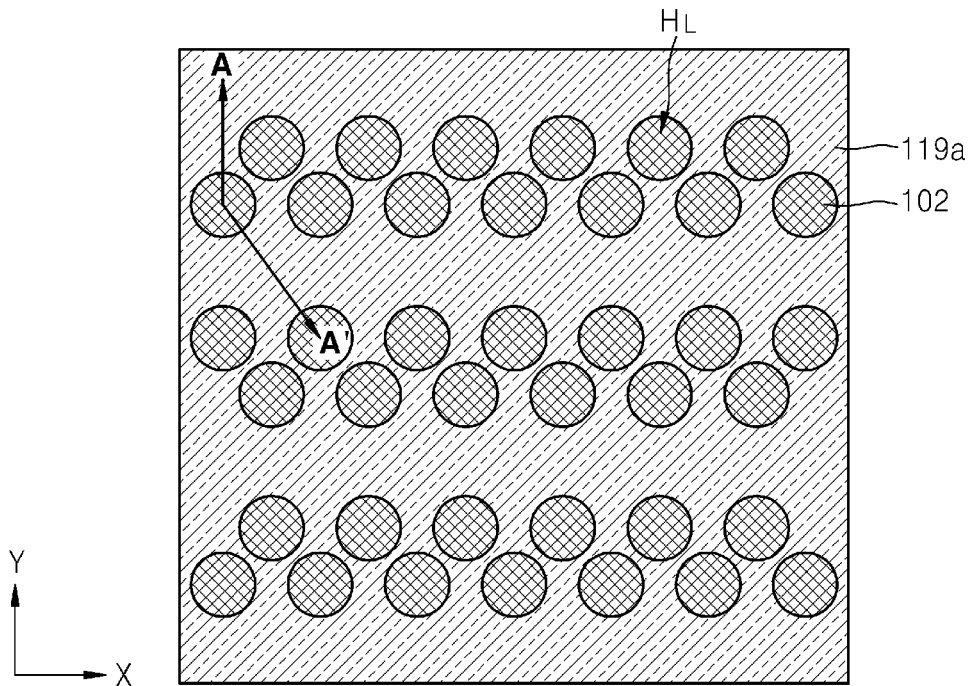
Figure 5B:
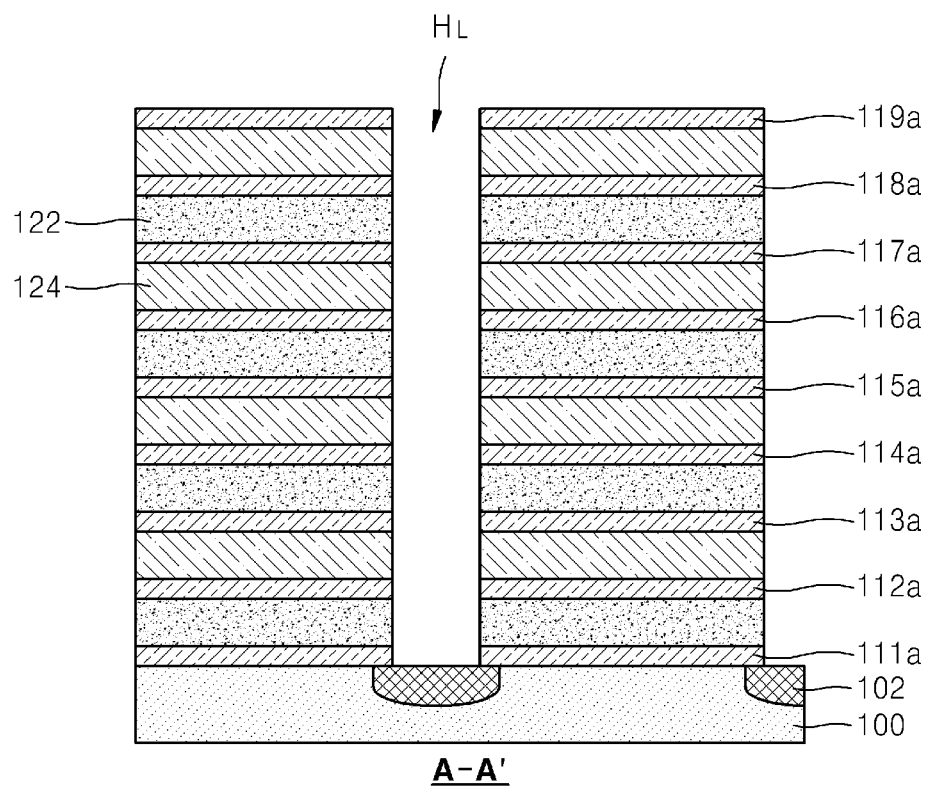

Referring to FIGS. 5A and 5B, a plurality of holes $H_L$ penetrating through the interlayer insulating layers 111a through 119a, the first sacrificial layer 122, and the second sacrificial layer 124 to expose the impurity regions 102 are formed by an anisotropic etching process. The plurality of holes $H_L$ are arranged in units each including two columns of the holes, wherein the units are spaced a predetermined distance in the y direction and the holes $H_L$ in each unit are arranged in zig-zags in the x direction.

The units of holes $H_L$ may have various vertical profiles (cross-sectional shapes in a vertical plane), for example, trapezoidal profiles in which the tops are wider than their bottoms. However, for ease of illustration, the holes $H_L$ are shown in FIG. 5B as having rectangular vertical profiles.

Figure 6A:
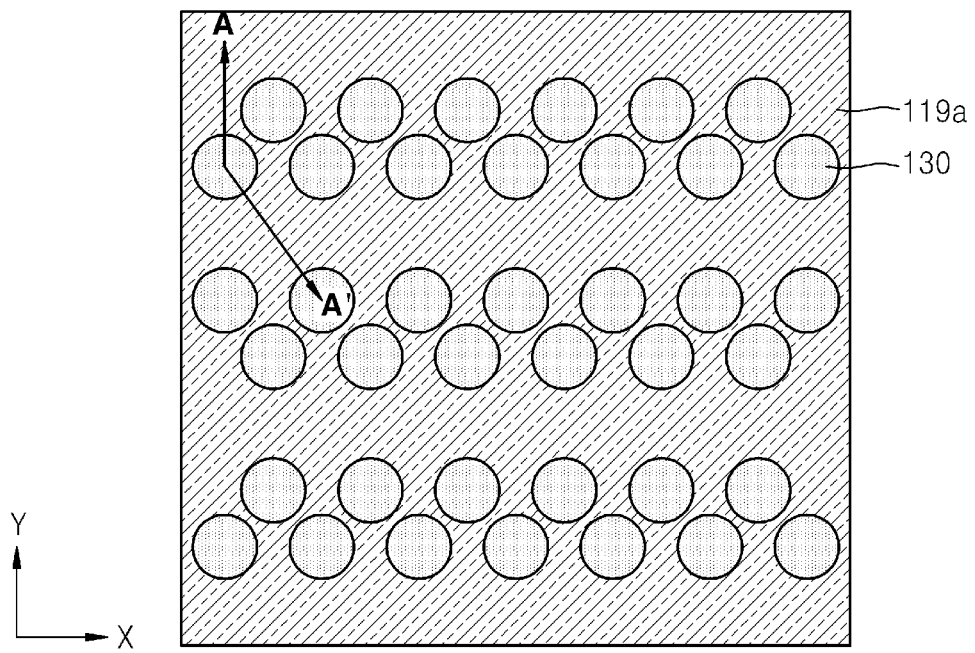
Figure 6B:
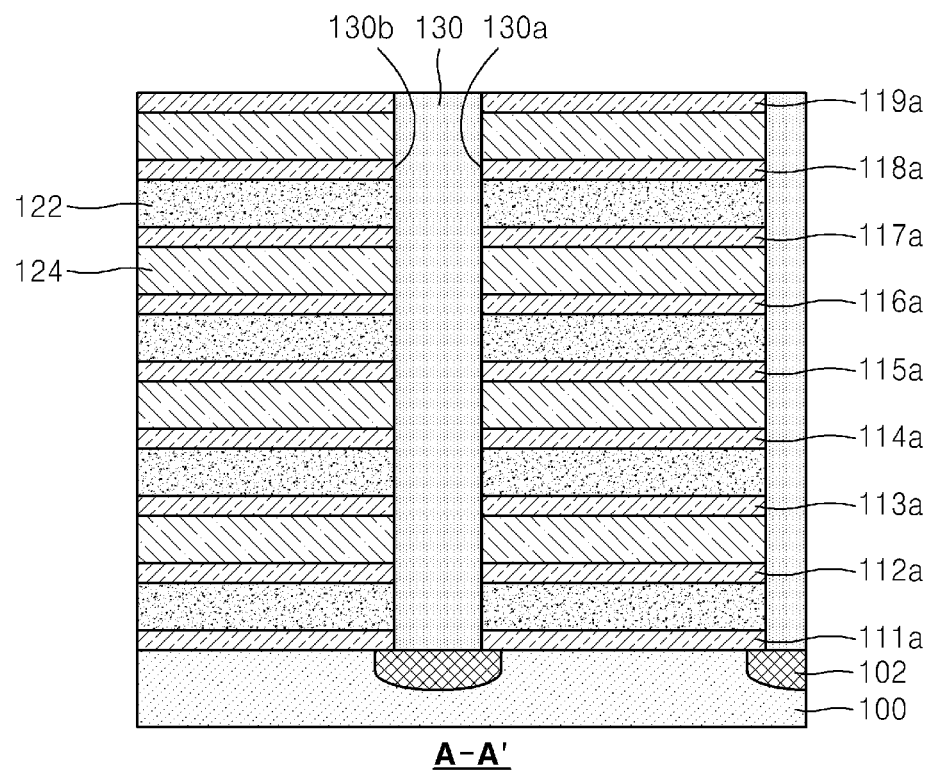

Referring to FIGS. 6A and 6B, the plurality of holes $H_L$ are filled with a semiconductor material, and then, upper surfaces of the resulting structure is planarized by a chemical mechanical polishing process to form the first pillars 130.

The semiconductor material may include, for example, at least one of single-crystalline silicon or polysilicon, and germanium. The semiconductor material may further include p-type impurities or n-type impurities.

Figure 7A:
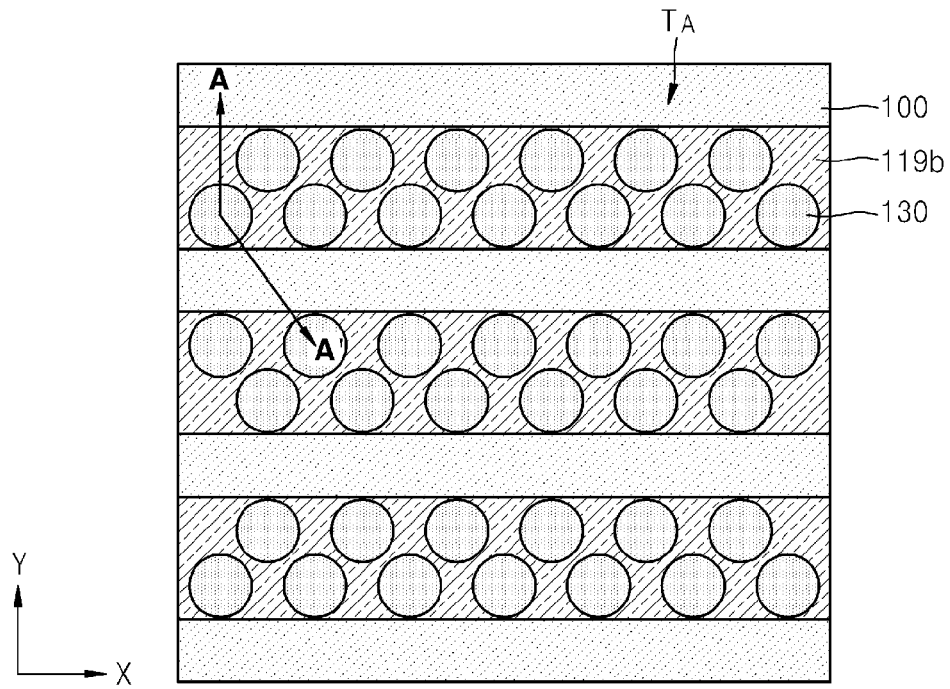
Figure 7B:
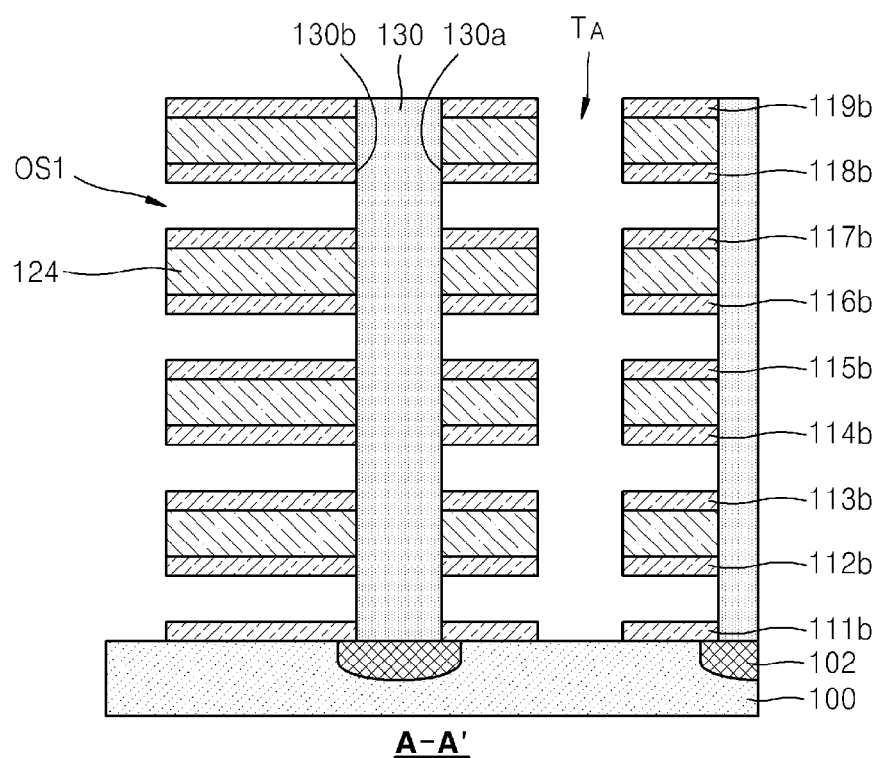

Referring to FIGS. 7A and 7B, the interlayer insulating layers 111a through 119a, the first sacrificial layer 122, and the second sacrificial layer 124 are etched to form trenches $T_A$ that are formed as lines extending in the x and y directions and expose the main surface of the substrate 100, and side surfaces of the first and second sacrificial layers 122 and 124 and the interlayer insulating layers 111b through 119b.

Next, the first sacrificial layer 122 is removed by an etching process to form slits OS1 exposing the first and second side surfaces 130a and 130b of the first pillars 130 between the interlayer insulating layers 111b and 112b, between the interlayer insulating layers 113b and 114b, between the interlayer insulating layers 115b and 116b, and between the interlayer insulating layers 117b and 118b.

Figure 8A:
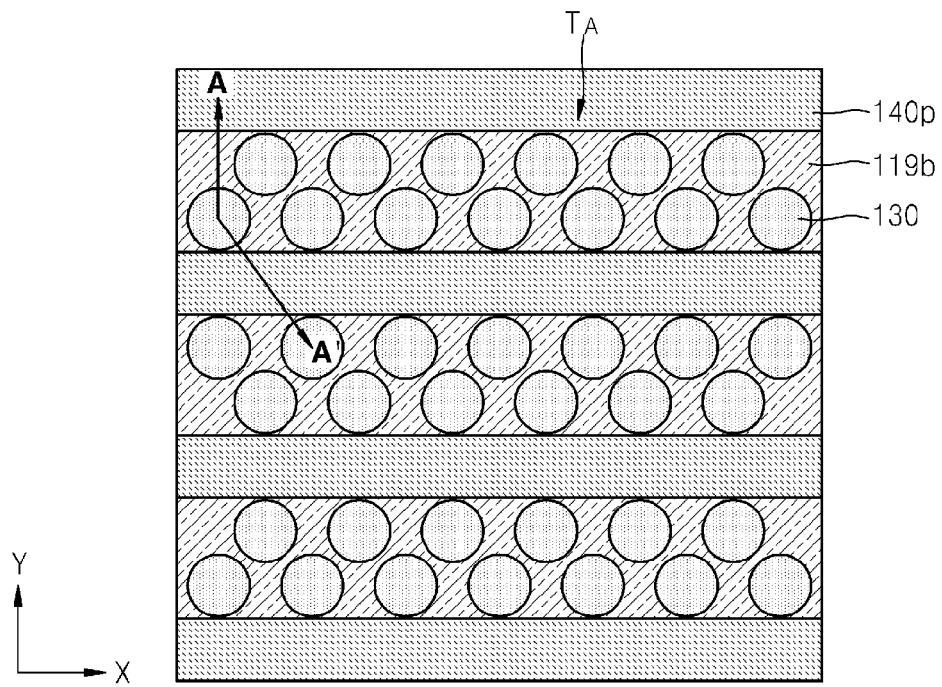
Figure 8B:
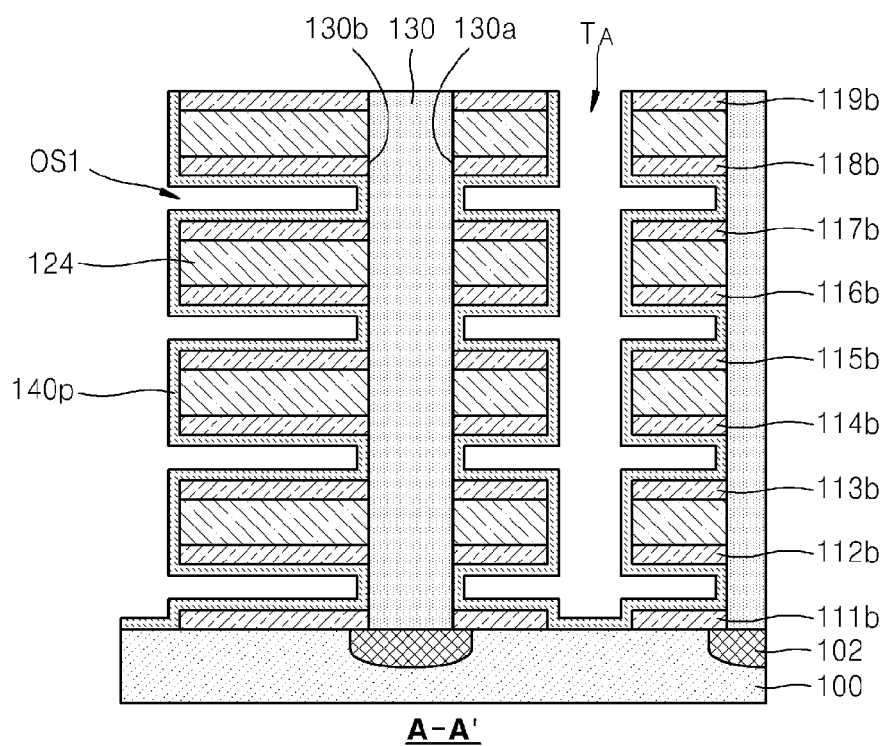

Referring to FIGS. 8A and 8B, a preliminary variable resistance layer 140p is formed to cover the main surface of the substrate 100 that is exposed by the trenches $T_A$ and the slits OS1, the side surface of the second sacrificial layer 124, exposed surfaces of the interlayer insulating layers 111b through 119b, the upper surface of the first pillar 130, and the first and second side surfaces 130a and 130b of the first pillars 130 that are exposed between the interlayer insulating layers 111b through 119b.

The preliminary variable resistance layer 140p may be formed of at least one of HafOx, TiOx, TaOx, ZnO, $Ti_2O$, $Nb_2O_5$, $ZrO_2$, and NiO. Also, the preliminary variable resistance layer 140p may include a phase changing material or provide a magnetic tunnel junction (MTJ). The preliminary variable resistance layer 140p may be formed as a single layer or as a plurality of layers. The preliminary variable resistance layer 140p may be formed to have a metal-insulator-metal (MIM) structure or a metal-insulator-semiconductor (MIS) structure.

Figure 9A:
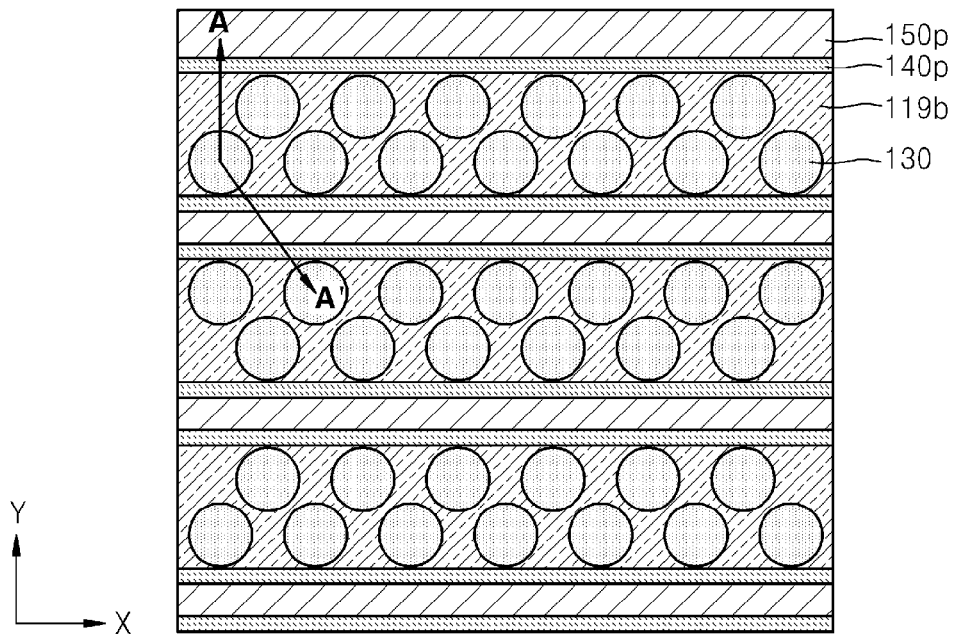
Figure 9B:
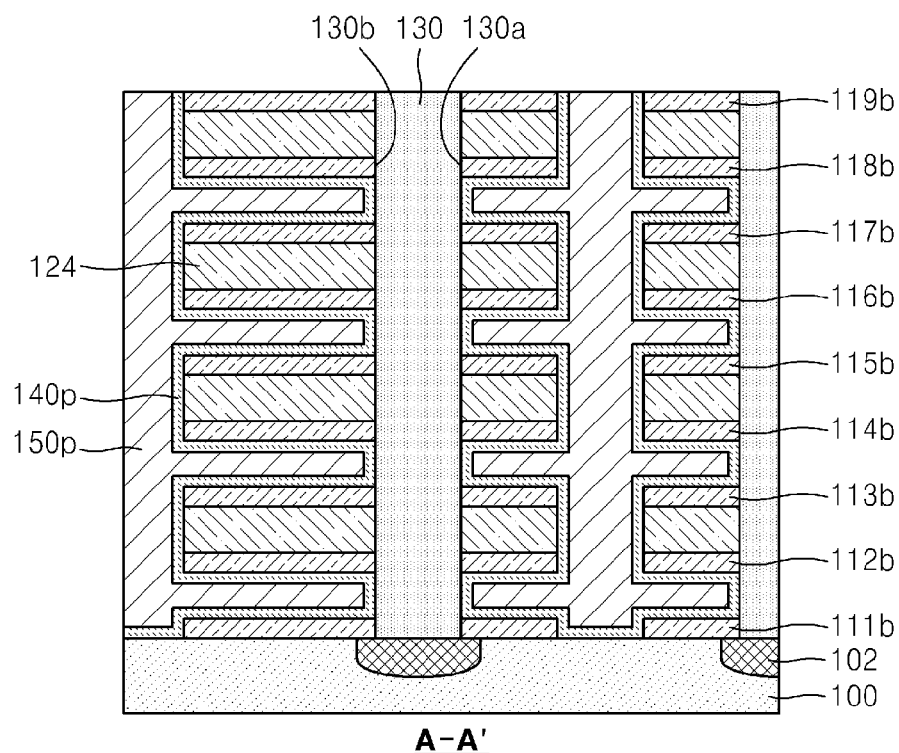

Referring to FIGS. 9A and 9B, the trenches $T_A$ and the slits OS1 are filled with a conductive material 150p, and an upper surface of the resulting structure is planarized.

The conductive material 150p may be polysilicon, or a metal material such as TiN, W, or Pt.

Figure 10A:
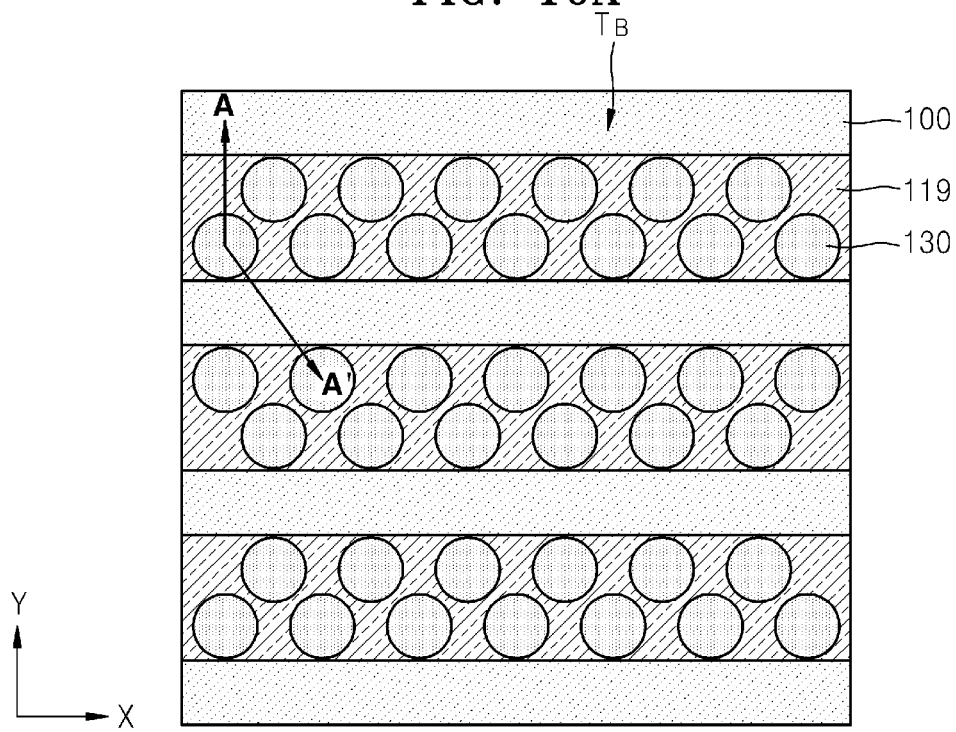
Figure 10B:
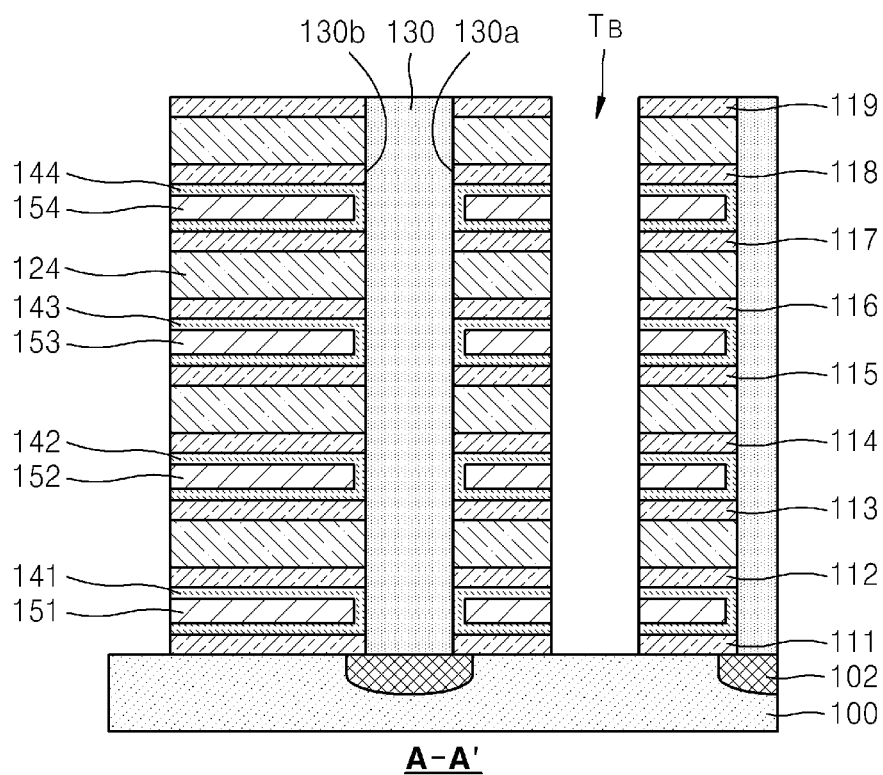

Referring to FIGS. 10A and 10B, trenches $T_B$ are formed as lines extending in the x and y directions. The first conductive layer patterns 151 through 154, nodes of which are divided by the first pillars 130 that are arranged in two columns, may be formed as a result. Also, the variable resistance layers 141 through 144 that cover the upper and bottom surfaces of the first conductive layer patterns 151 through 154 and are disposed between the side surfaces of the first conductive layer patterns 151 through 154 and the first side surface 130a of the first pillar 130, and between the side surfaces of the first conductive layer patterns 151 through 154 and the second side surface 130b of the first pillar 130 are formed. In addition, the interlayer insulating layer patterns 111 through 119 are formed from the interlayer insulating layers 111b through 119b, respectively.

Although FIG. 10B shows that the side surfaces of the interlayer insulating layer patterns 111 through 119, the side surface of the second sacrificial layer 124, the side surfaces of the variable resistance layers 141 through 144, and the side surfaces of the first conductive layer patterns 151 through 154 are coplanar with each other, the present inventive concept is not limited thereto. During an etching process for forming the trenches $T_B$, the first conductive layer patterns 151 through 154 and the variable resistance layers 141 through 144 may be over-etched so as to form a depressed portion in the first conductive layer patterns 151 through 154 and the variable resistance layers 141 through 144.

Figure 11A:
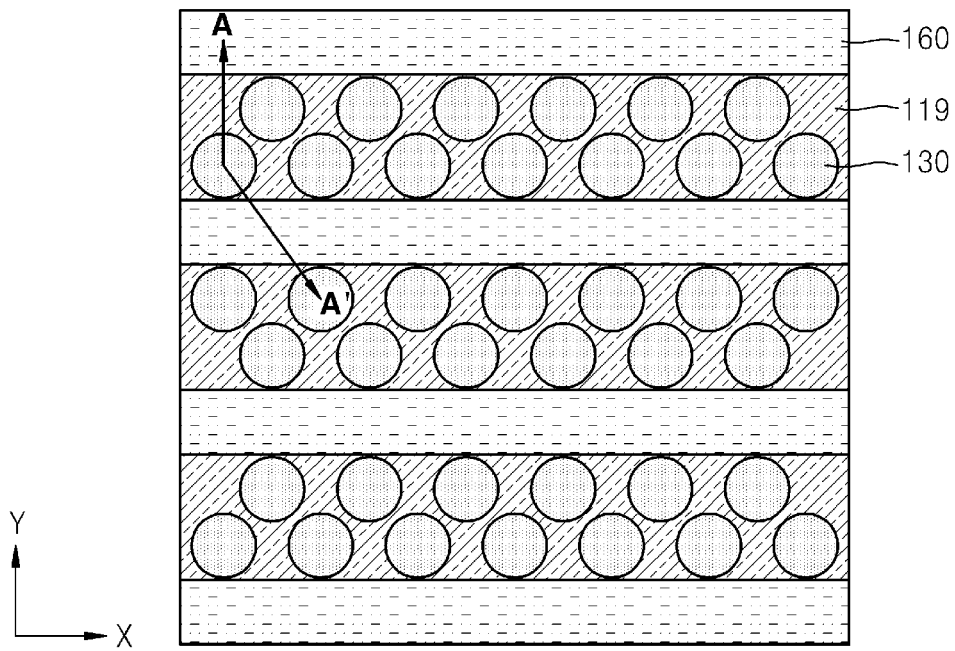
Figure 11B:
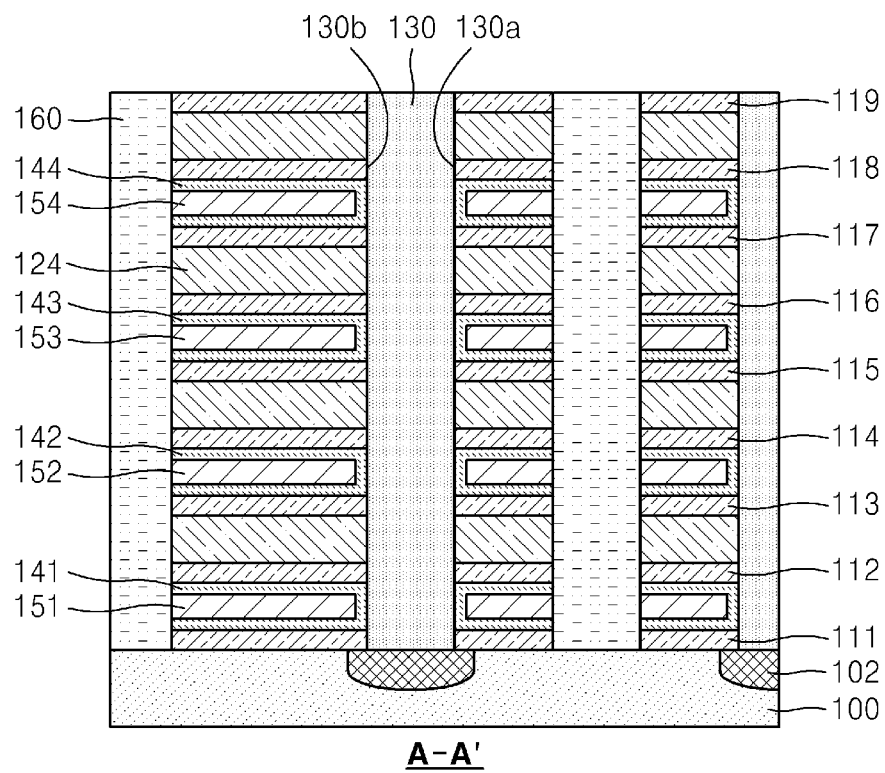

Referring to FIGS. 11A and 11B, the trenches $T_B$ are filled with an insulating material and upper surface of the resulting structure is planarized to form the insulating regions 160.

The insulating material may be an oxide layer, a nitride layer, an oxynitride layer, or a combination thereof.

Figure 12A:
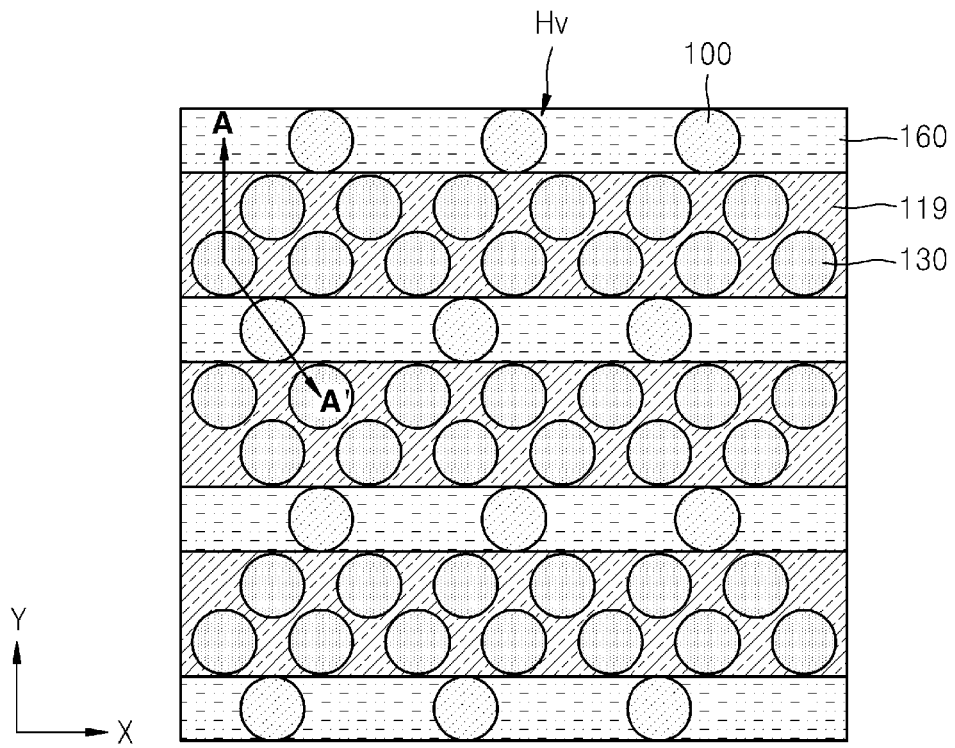
Figure 12B:
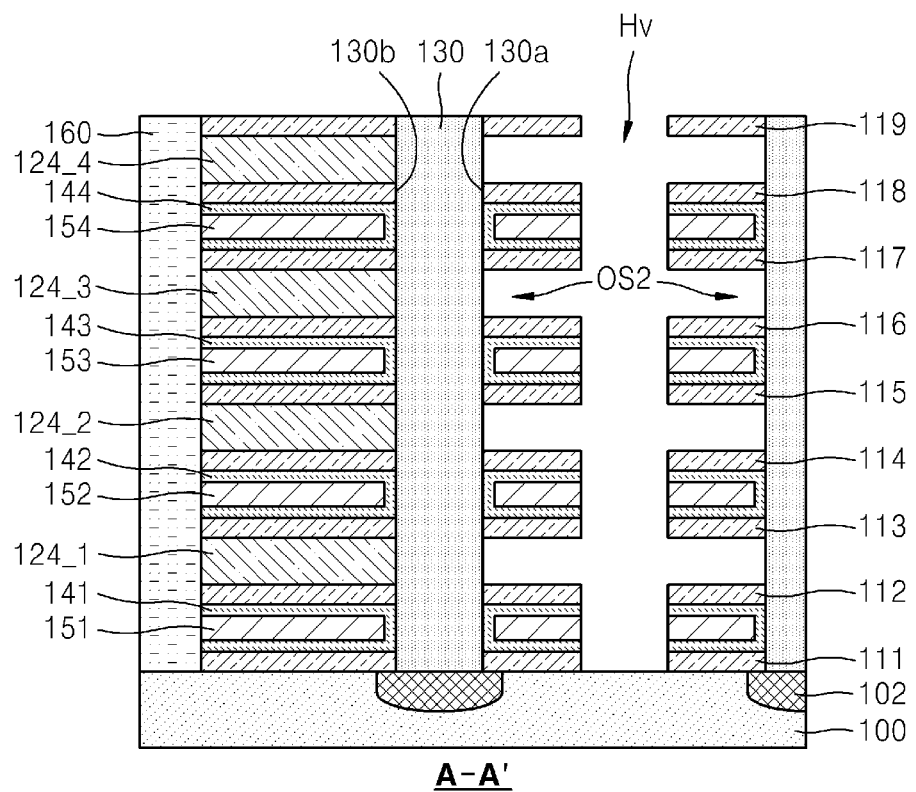

Referring to FIGS. 12A and 12B, a plurality of holes $H_V$ penetrating through the insulating regions 160 and exposing the main surface of the substrate 100 are formed by an etching process. The plurality of holes $H_V$ are arranged in a row in each of the insulating regions 160 and are adjacent to two first pillars 130 at each of both of the opposite sides of the insulating region 160, that is, each hole $H_V$ is adjacent four first pillars 130.

Each of the plurality of holes $H_V$ may be formed to have various vertical profiles, such as a trapezoidal profile having an upper portion that is longer than a lower portion; however, it each of the holes $H_V$ is shown for ease of illustration as having upper and lower portions of equal width.

In addition, the second sacrificial layer 124 that is exposed at inner side surfaces of the plurality of holes $H_V$ is removed by the etching process so as to form slits OS2 exposing the first side surface 130a of the first pillars 130 between the interlayer insulating layer patterns 111 and 112, between the interlayer insulating layer patterns 113 and 114, between the interlayer insulating layer patterns 115 and 116, and between the interlayer insulating layer patterns 117 and 118. At this time, part the second sacrificial layer 124 remains on the second side surface 130b of the first pillar 130, and thus, residual sacrificial layer patterns 124_1 through 124_4 are formed.

Figure 13A:
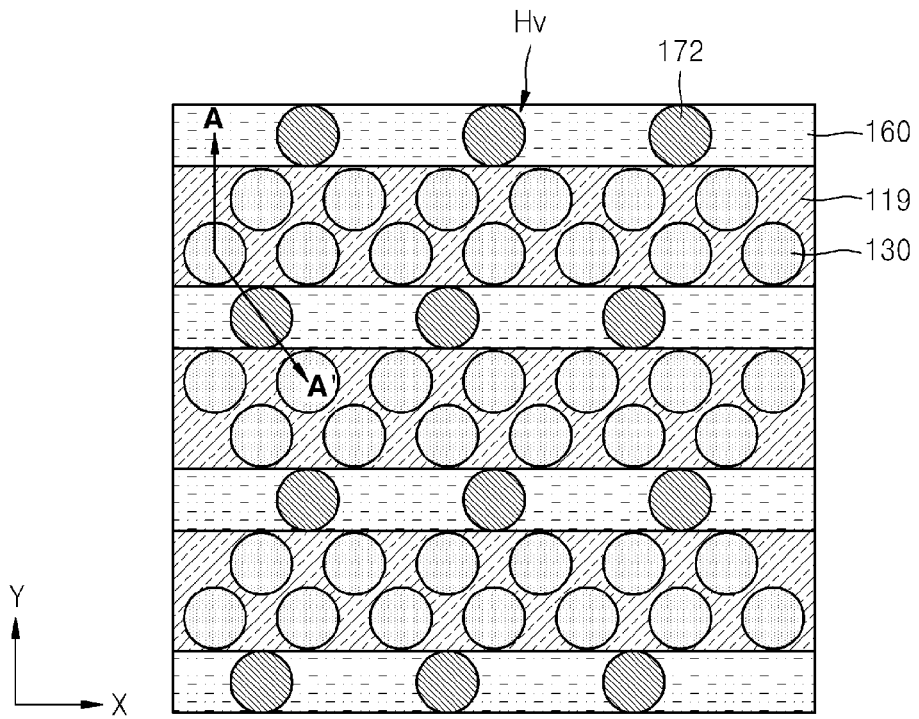
Figure 13B:
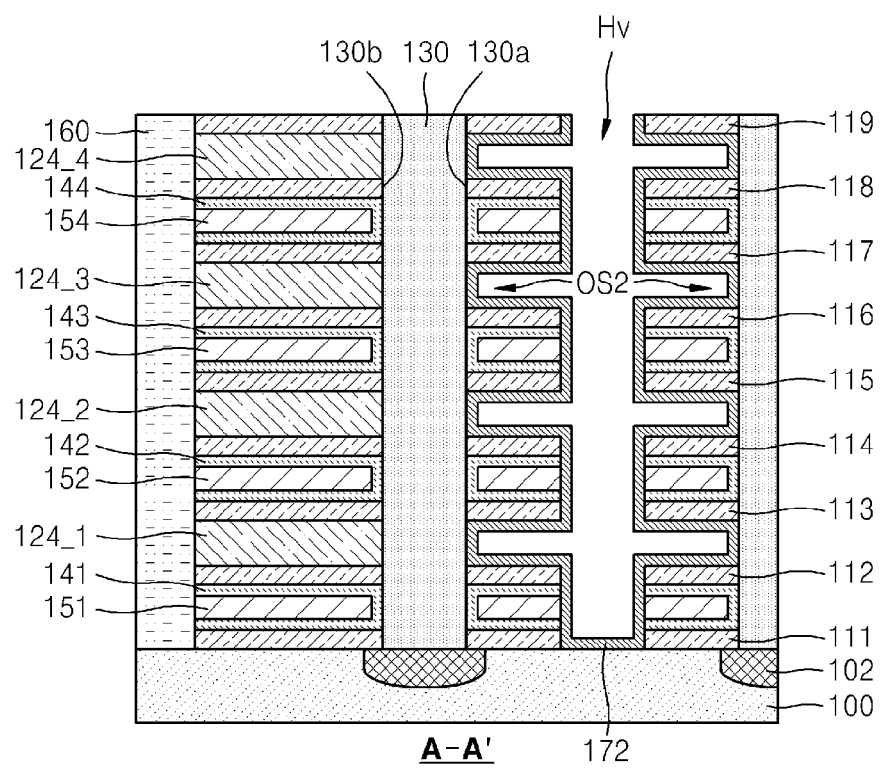

Referring to FIGS. 13A and 13B, the main surface of the substrate 100, the exposed surfaces of the interlayer insulating layer patterns 111 through 119, the upper surfaces of the first pillars 130, and the first side surface 130a of the first pillars 130 between the interlayer insulating layer patterns 111 through 119 exposed through the holes $H_V$ and the slits OS2 are covered by an insulating material.

The insulating material may include at least one of a silicon oxide layer, a silicon nitride layer, a silicon oxynitride layer, an ONO layer, and a high-k dielectric film having a dielectric constant that is greater than that of silicon oxide.

In addition, an upper surface is planarized to form the insulating layer 172 covering the main surface of the substrate 100, the side surfaces of the interlayer insulating layer patterns 111 through 119, and the first side surfaces 130a of the first pillars 130 between the interlayer insulating layer patterns 111 through 119.

Figure 14A:
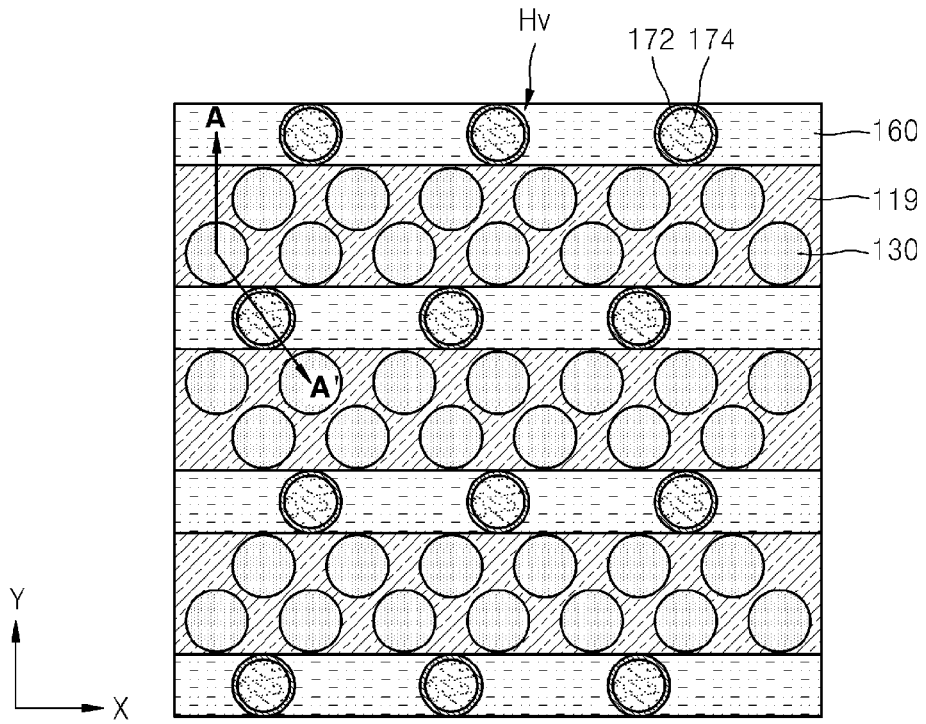
Figure 14B:
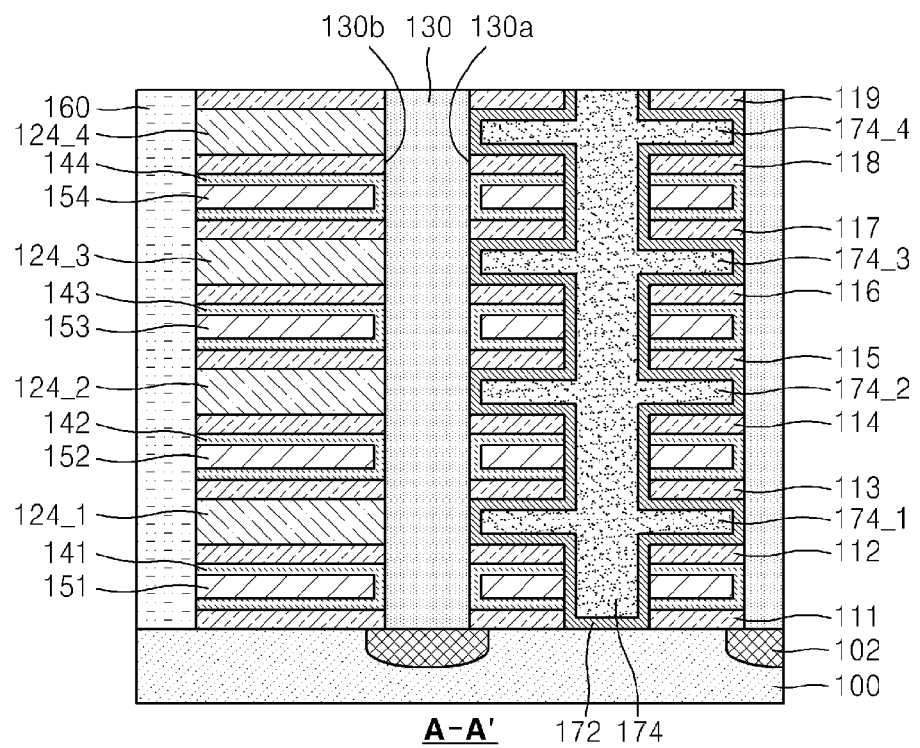

Referring to FIGS. 14A and 14B, the plurality of holes $H_V$ and the slits OS2 are filled with a conductive material to cover the insulating layer 172 exposed through the plurality of holes $H_V$ and the slits OS2, and then, an upper surface is planarized. As such, second pillars 174 including the second conductive layer patterns 174_1 through 174_4 are formed. The conductive material may be polysilicon or a metal material such as TiN, W, or Pt.

Figure 15A:
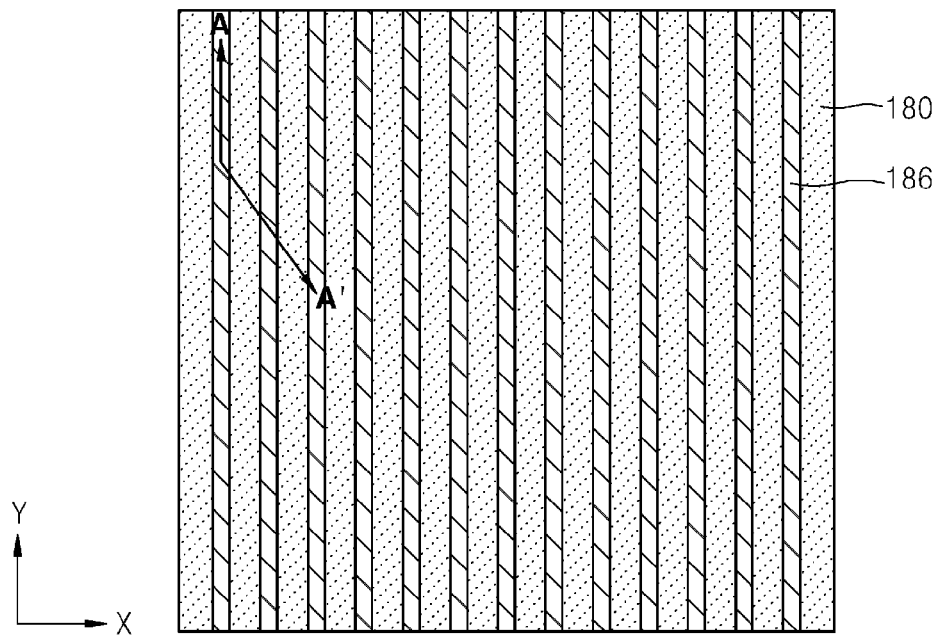
Figure 15B:
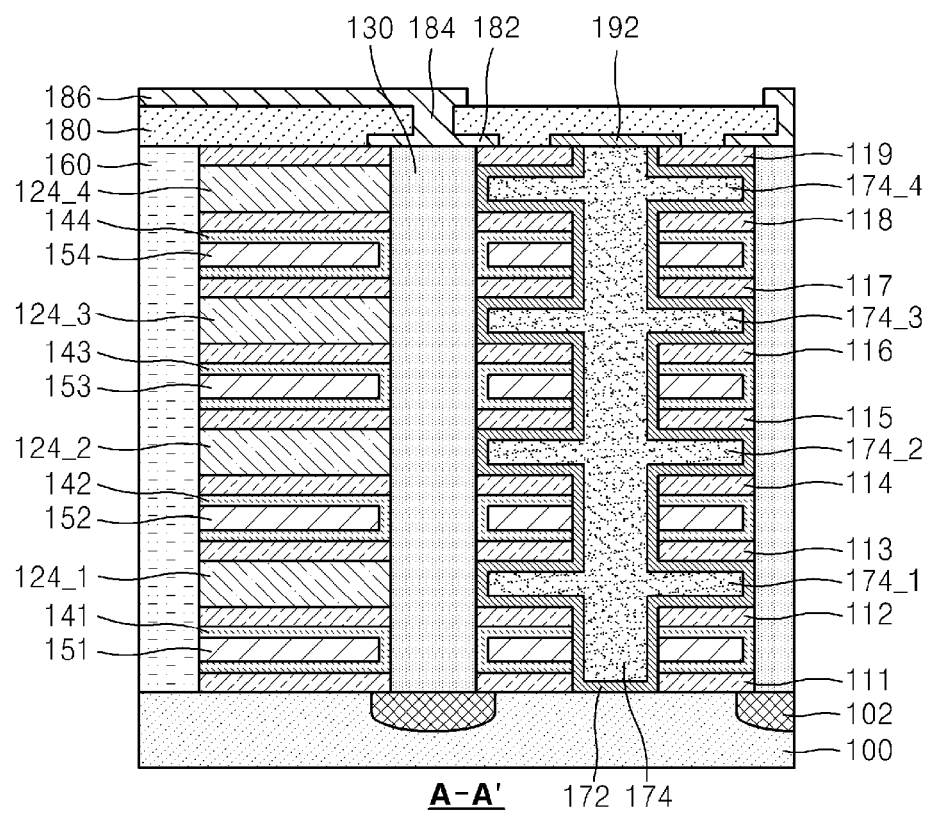

Referring to FIGS. 15A and 15B, the contact pads 182 are formed on the upper surfaces of the first pillars 130, and the contact pads 192 are formed on the upper surfaces of the second pillars 174. In addition, the insulating layer 180 between first wires is formed to cover the contact pads 182, the contact pads 192, the uppermost interlayer insulating layer pattern 119, and the insulating regions 160. The insulating layer 180 between the first wires may be formed as an oxide layer or a nitride layer.

The contact plugs 184 are formed through the insulating layer 180 between first wires and are connected to the contact pads 182 through a patterning process, and the first wiring layer 186 is formed by a patterning process as extending in the y direction and connecting to the contact plugs 184.

Figure 16A:
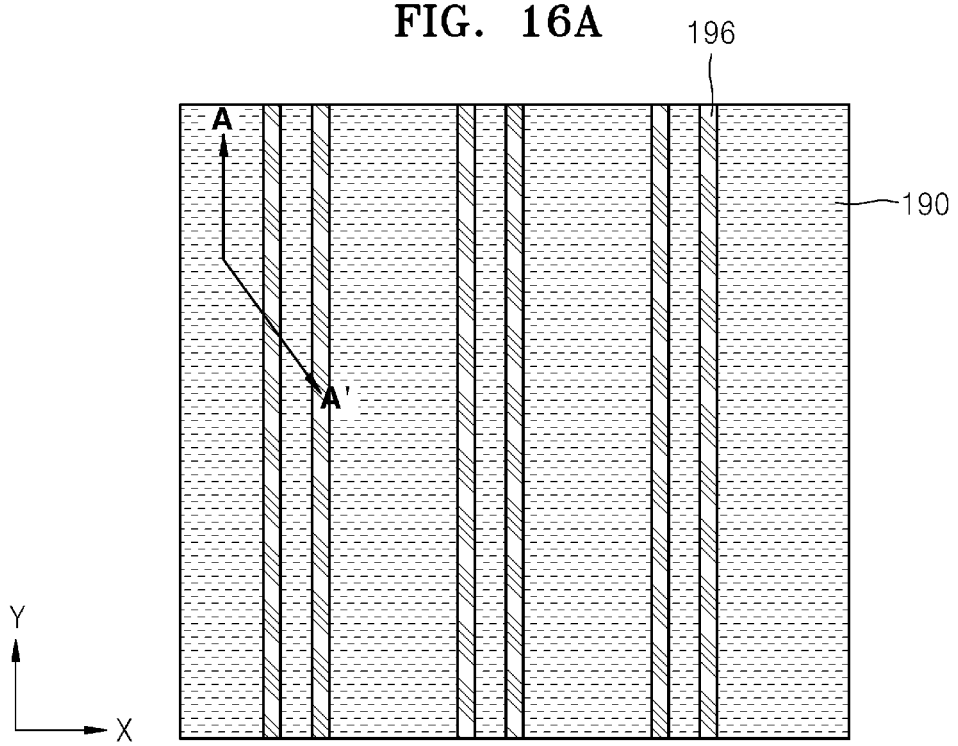
Figure 16B:
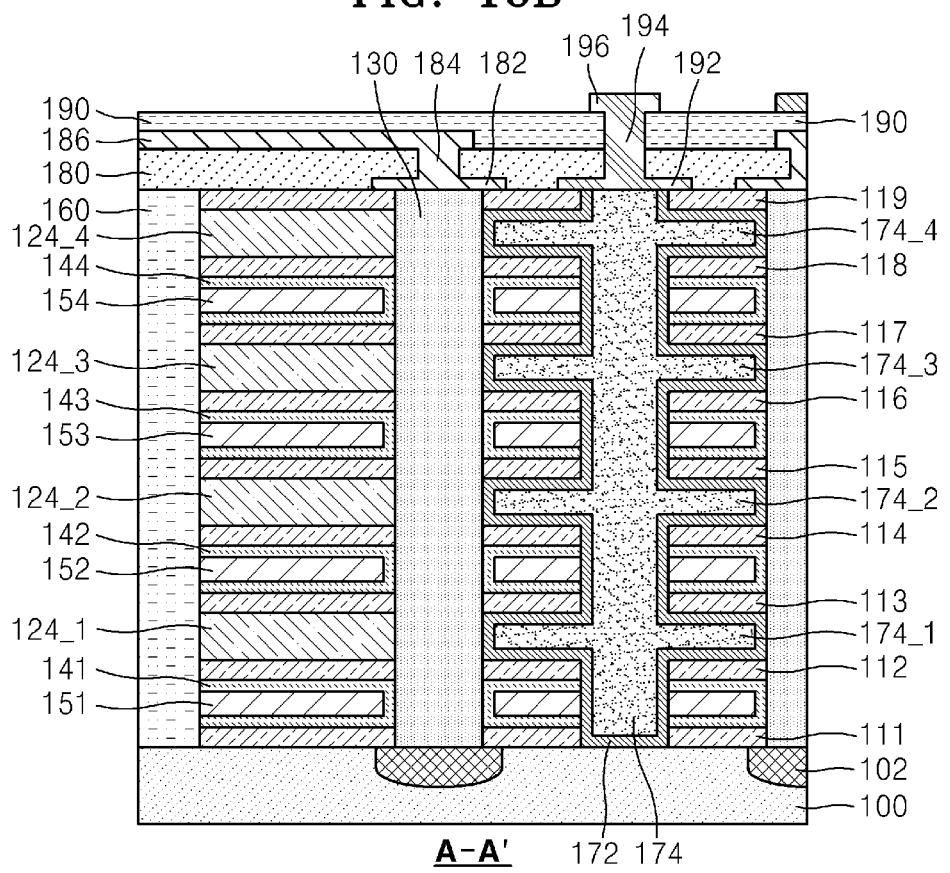

Referring to FIGS. 16A and 16B, the insulating layer 190 between second wires is formed to cover the first wiring layer 186. The insulating layer 190 between second wires may be formed as an oxide layer or a nitride layer.

In addition, the contact plugs 194 are formed through the insulating layer 180 between first wires and the insulating layer 190 between second wires and are connected to the contact pads 192. Also, the second wiring layer 196 may be formed by a patterning process as extending in the y direction and connecting to the contact plugs 194.

The second wiring layer 196 extending in the y direction may be formed on the insulating layer 190 between the second wires. The second wiring layer 196 may be connected to the contact pads 192 via the contact plugs 194 that penetrate through the insulating layer 180 between first wires and the insulating layer 190 between second wires.

Another embodiment of a semiconductor memory device 20 according to present inventive concept will now be described with reference to FIGS. 17A-17C.

Figure 17A:
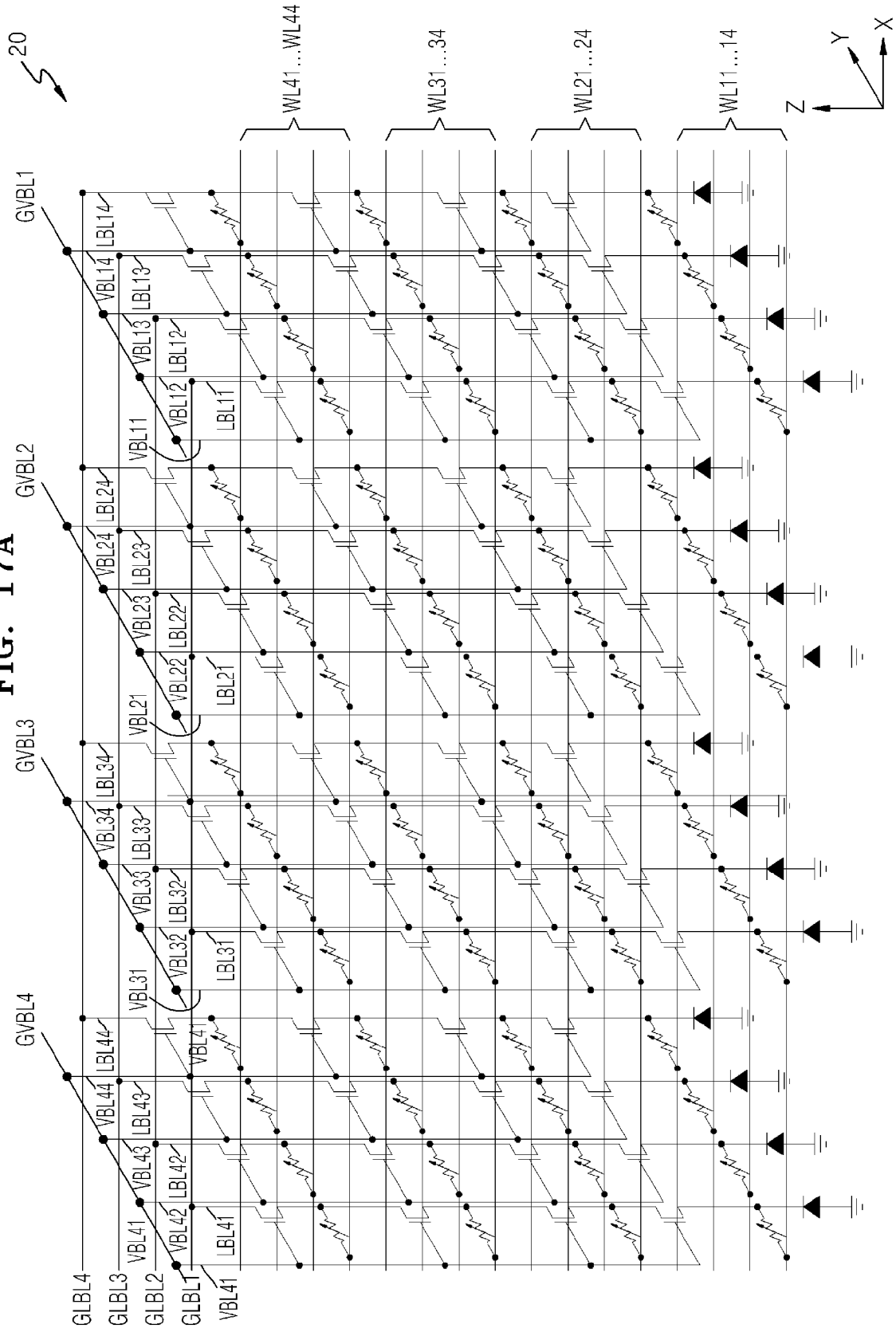
FIG. 17A is a equivalent circuit diagram of another embodiment of a semiconductor memory device according to the present inventive concept.

Referring to the equivalent circuit diagram of FIG. 17A, the local bit lines LBL11, LBL21, LBL31, and LBL41 of the semiconductor memory device 20 may be commonly connected to the global local bit line GLBL1 extending in the x direction. That is, drains of uppermost transistors in the local bit lines LBL11 through LBL41 are commonly connected to the global local bit line GLBL1. Likewise, the local bit lines LBL12, LBL22, LBL32, and LBL42 may be commonly connected to the global local bit line GLBL2, the local bit lines LBL13 through LBL43 may be commonly connected to the global local bit line GLBL3, and the local bit lines LBL14, LBL24, LBL34, and LBL44 may be commonly connected to the global local bit line GLBL4. In such a device 20 as described above, the local bit lines may be driven as groups via the global local bit lines.

The virtual bit lines VBL11, VBL12, VBL13, and VBL14 may be commonly connected to the global virtual bit line GVBL1 extending in the y direction. Likewise, the virtual bit lines VBL21, VBL22, VBL23, and VBL24 may be commonly connected to the global virtual bit line GVBL2, the virtual bit lines VBL31, VBL32, VBL33, and VBL34 may be commonly connected to the global virtual bit line GVBL3, and the virtual bit lines VBL41, VBL42, VBL43, and VBL44 may be commonly connected to the global virtual bit line GVBL4.

Figure 17B:
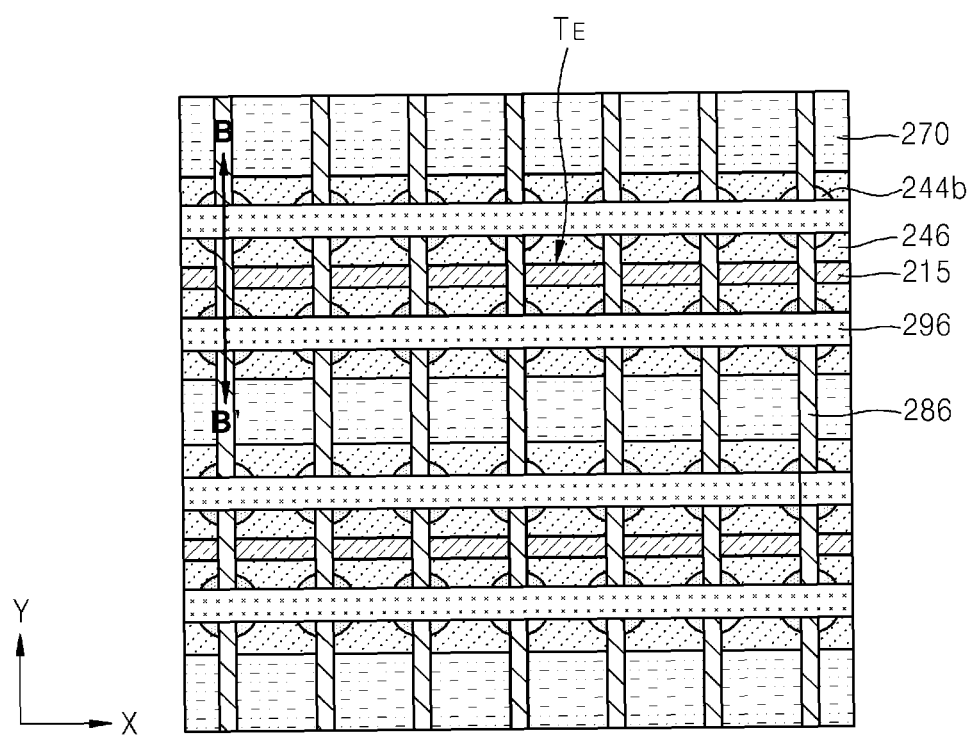
FIG. 17B is a plan view of layouts of some components shown in FIG. 17A.
Figure 17C:
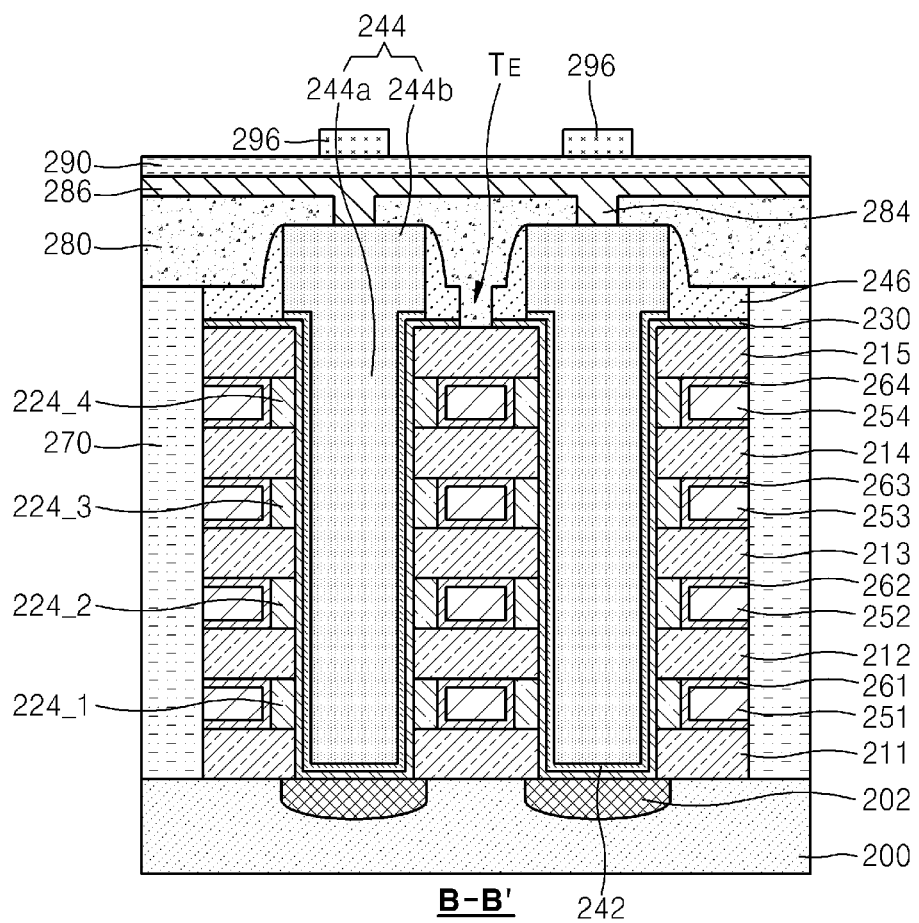
FIG. 17C is a cross-sectional view of the semiconductor memory device taken along line C-C' of FIG. 17B.

Referring to FIGS. 17B and 17C, impurity regions 202 may be formed in a substrate 200. The impurity regions 202 may be formed as islands and may be spaced by constant intervals in the x direction so as to correspond to the arrangements of third pillars 244 that are formed on the impurity regions 202 as a matrix.

The third pillars 244 may extend in a direction perpendicular to the x and y directions, that is, the z direction, on the impurity regions 202, respectively. The third pillars 244 may be formed of a conductive material, for example, polysilicon or a metal. The third pillars 244 may correspond to gates of the virtual bit lines and the local bit lines shown in FIG. 17A.

Units of the third pillars 244 may be divided from one another by insulating regions 270 that extend as lines along the x and z directions on a main surface of the substrate 200.

For example, two columns in the x direction of the third pillars 244 may be arranged between neighboring insulating regions 270 of each respective pair thereof. The third pillars 244 arranged in two columns between the neighboring insulating regions 270 may be arranged as a matrix in which the third pillars 244 are separate from each other with constant intervals in the x and y directions. The third pillars 244 of two units separated from one another by an insulating region 270 may be symmetrically arranged with one another about the insulating region 270; however, the present inventive concept is not limited to such an arrangement. That is, the third pillars 244 of adjacent units of may be asymmetrically arranged about the insulating region 270 therebetween.

Each of the third pillars 244 may include a first portion 244a and a second portion 244b having different widths in the x direction (or the y direction). The first portion 244a may penetrate through third interlayer insulating layer patterns 211 through 215 and third conductive layer patterns 251 through 254 that are alternately and repeatedly stacked on the main surface of the substrate 200. The second portion 244b may protrude from the uppermost third interlayer insulating layer pattern 215. A width of the first portion 244a in the x direction (or the y direction) may be less than that of the second portion 244b.

The first portion 244a and the second portion 244b of the third pillar 244 may be formed as cylinders having circular cross sections in a plane perpendicular to the z direction (horizontal cross-sectional shapes); however the horizontal cross-sectional shapes are not so limited. That is, the first and second portions 244a and 244b of the third pillar 244 may each have a polygonal cross section in a plane perpendicular to the z direction. Alternatively, the first portion 244a and the second portion 244b of the third pillar 244 may have different horizontal cross-sectional shapes.

The third interlayer insulating layer patterns 211 through 215 and the third conductive layer patterns 251 through 254 may be alternately and repeatedly stacked in the z direction along a side surface of the first portion 244a in each of the third pillars 244 between the insulating regions 270.

In particular, the third conductive layer pattern 251 may be formed on the third interlayer insulating layer pattern 211. The third interlayer insulating layer pattern 212 may be formed on the third conductive layer pattern 251. The third conductive layer pattern 252 may be formed on the third interlayer insulating layer pattern 212. The third interlayer insulating layer pattern 213 may be formed on the third conductive layer pattern 252. The third conductive layer pattern 253 may be formed on the third interlayer insulating layer pattern 213. The third interlayer insulating layer pattern 214 may be formed on the third conductive layer pattern 253. The third conductive layer pattern 254 may be formed on the third interlayer insulating layer pattern 214. The third interlayer insulating layer pattern 215 may be formed on the third conductive layer pattern 254.

Fourth conductive layer patterns 224_1 through 224_4 may be disposed between the third conductive layer patterns 251 through 254 and the first portion 244a of the third pillar 244. The fourth conductive layer patterns 224_1 through 224_4 are annular and surround the first portion 244a of each of the third pillars 244 at the same levels (i.e., in the z direction) as the corresponding third conductive layer patterns 251 through 254.

More specifically, the fourth conductive layer pattern 224_1 may be formed to surround the side surface of the first portion 244a of the third pillar 244 at the same level as that of the third conductive layer pattern 251 between the third interlayer insulating layer patterns 211 and 212. The fourth conductive layer pattern 224_2 may be formed to surround the side surface of the first portion 244a of the third pillar 244 at the same level as that of the third conductive layer pattern 252 between the third interlayer insulating layer patterns 212 and 213. The fourth conductive layer pattern 224_3 may be formed to surround the side surface of the first portion 244a of the third pillar 244 at the same level as that of the third conductive layer pattern 253 between the third interlayer insulating layer patterns 213 and 214. The fourth conductive layer pattern 224_4 may be formed to surround the side surface of the first portion 244a of the third pillar 244 at the same level as that of the third conductive layer pattern 254 between the third interlayer insulating layer patterns 214 and 215.

An insulating layer 242 may be formed on side surfaces and a lower surface of the first portion 244a in the third pillar 244. In addition, a semiconductor layer 230 may be formed on the insulating layer 242.

Accordingly, the semiconductor layer 230 and the insulating layer 242 may be disposed between the fourth conductive layer patterns 224_1 through 224_4 and the interlayer insulating layer patterns 211 through 215 that are alternately and repeatedly stacked and the first portion 244a of the third pillar 244. That is, the fourth conductive layer patterns 224_1 through 224_4 and the interlayer insulating layer patterns 211 through 215 may contact the semiconductor layer 230. In addition, the insulating layer 242 may further extend from the side surface of the first portion 244a of the third pillar 244 to at least a part of a lower surface of the second portion 244b in the third pillar 244. The semiconductor layer 230 may further extend on an upper surface of the uppermost interlayer insulating layer pattern 215.

In the above-described structure, the semiconductor layer 230 corresponds to the channels of the local bit lines in the circuit shown in FIG. 17A, the insulating layer 242 corresponds to the gate insulating layers, the third pillars 244 correspond to the common gates, and the semiconductor layer 230 formed on the upper surface of the uppermost interlayer insulating layer pattern 215 may correspond to source/drain. That is, the local bit lines and the virtual bit lines may be realized.

Variable resistance layers 261 through 264 may be respectively disposed between corresponding third conductive layer patterns 251 through 254 and fourth conductive layer patterns 224_1 through 224_4. The variable resistance layers 261 through 264 may respectively extend to upper and lower surfaces of the corresponding third conductive layer patterns 251 through 254.

In the above-described structure, the third conductive layer patterns 251 through 254 correspond to the word lines, the fourth conductive layer patterns 224_1 through 224_4 correspond to the lower electrodes contacting the semiconductor layer 230, and the variable resistance layers 261 through 264 between the third conductive layer patterns 251 through 254 and the fourth conductive layer patterns 224_1 through 224_4 may correspond to the variable resistance memory cells.

A protective layer 246 may be formed on the uppermost interlayer insulating layer pattern 215 between the neighboring insulating regions 270. The protective layer 246 may be formed of an insulating material and may be formed to surround the second portion 244b of the third pillar 244 and to cover the semiconductor layer 230 formed on the upper surface of the uppermost interlayer insulating layer pattern 215.

A trench $T_E$ may be formed in some parts of the protective layer 246 and the semiconductor layer 230 between two adjacent third pillars 244 to separate the source and drain from each other between the adjacent third pillars 244 between the two neighboring insulating regions 270. To this end, the trench $T_E$ is formed as a line extending in the x direction, and may expose an upper surface of the uppermost interlayer insulating layer pattern 215.

An insulating layer 280 between first wires may be formed to cover the second portions 244b of the third pillars 244, the protective layer 246, and the insulating regions 270. A first wiring layer 286 extending in the y direction may be formed on the insulating layer 280 between first wires. The first wiring layer 286 may be connected to the second portions 244b of the third pillars 244 via contact plugs 284 penetrating through the insulating layer 280 between first wires. The first wiring layer 286 may correspond to the global virtual bit line shown in FIG. 17A.

An insulating layer 290 between second wires may be formed to cover the first wiring layer 286. The second wiring layer 296 may be connected to the semiconductor layer 230, nodes of which are divided, via the contact plugs (not shown, refer to 294 of FIG. 31C) penetrating through the insulating layer 280 between first wires and the insulating layer 290 between second wires. The second wiring layer 296 may correspond to the global local bit line shown in FIG. 17A.

A method of manufacturing the semiconductor memory device 20, shown in FIGS. 17A through 17C, will now be described in detail with reference to FIGS. 18A through 31C.

Figure 18A:
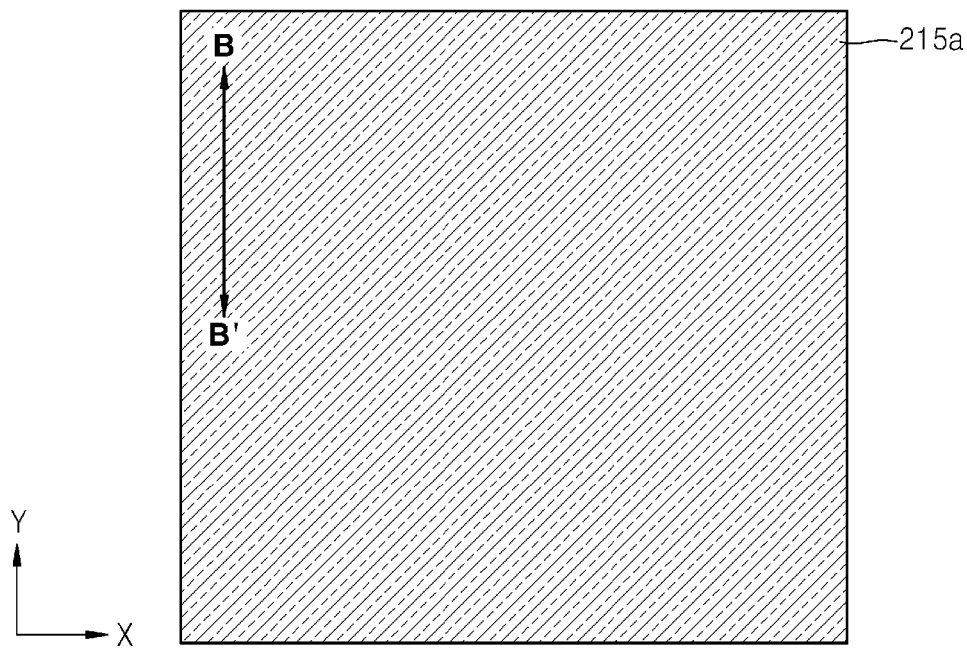
FIGS. 18A through 31C illustrate a method of manufacturing the semiconductor memory device shown in FIGS. 17A through 17B according to a processing order, with FIGS. 18A, 19A, 20A, 21A, 22A, 23A, 24A, 25A, 26A, 27A, 28A, 29A, 30A, and 31A being plan views of layouts of the semiconductor memory device during the course of its manufacture, FIGS. 18B, 19B, 20B, 21B, 22B, 23B, 24B, 25B, 26B, 27B, 28B, 29B, 30B, and 31B being cross-sectional views taken along lines B-B' of FIGS. 19A through 31A, respectively, and FIG. 31C being a cross-sectional view of the semiconductor memory device taken along line C-C' of FIG. 31A.
Figure 18B:
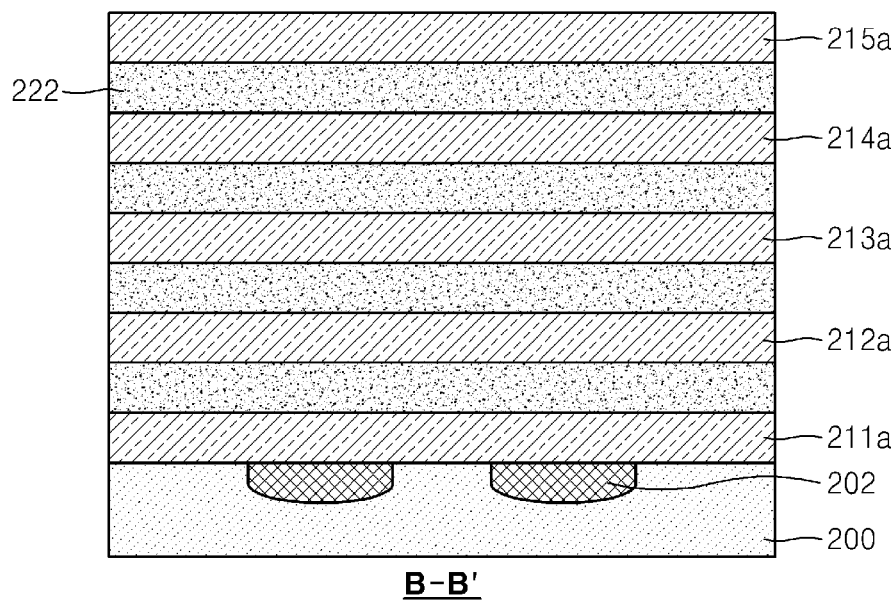

Referring to FIGS. 18A and 18B, interlayer insulating layers 211a through 215a and a sacrificial layer 222 are alternately and repeatedly stacked on the substrate 200, in which impurity regions 202 are formed. The interlayer insulating layers 211a through 215a and the sacrificial layer 222 may be formed by a chemical vapor deposition method.

The interlayer insulating layers 211a through 215a and the sacrificial layer 222 may be formed of materials having an etch selectivity with respect to each other. For example, the interlayer insulating layers 211a through 215a may be formed of oxide layers, and the sacrificial layer 222 may be formed of a nitride layer.

In FIG. 18B, the interlayer insulating layers 211a through 215a may each have a thickness that is equal to that of the sacrificial layer 222; however, the method is not limited thereto. Also, in another example of this embodiment, the interlayer insulating layer 211 a is not formed, i.e., is omitted. In still another example, the interlayer insulating layer 211a is formed as a thin oxide layer that is thinner than each of the interlayer insulating layers 212a through 215a.

Figure 19A:
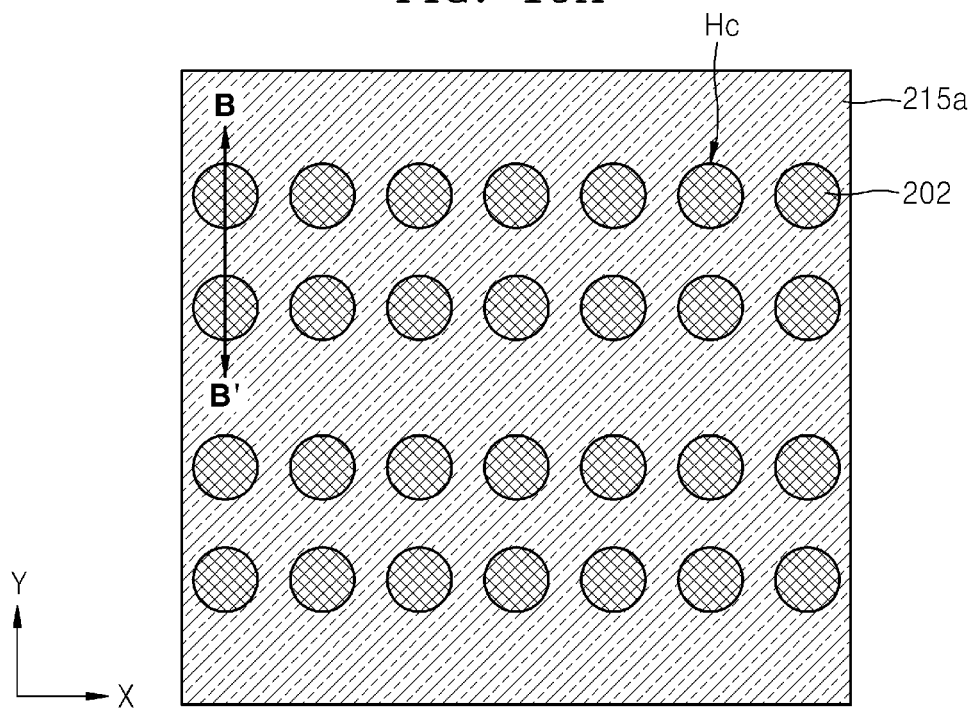
Figure 19B:
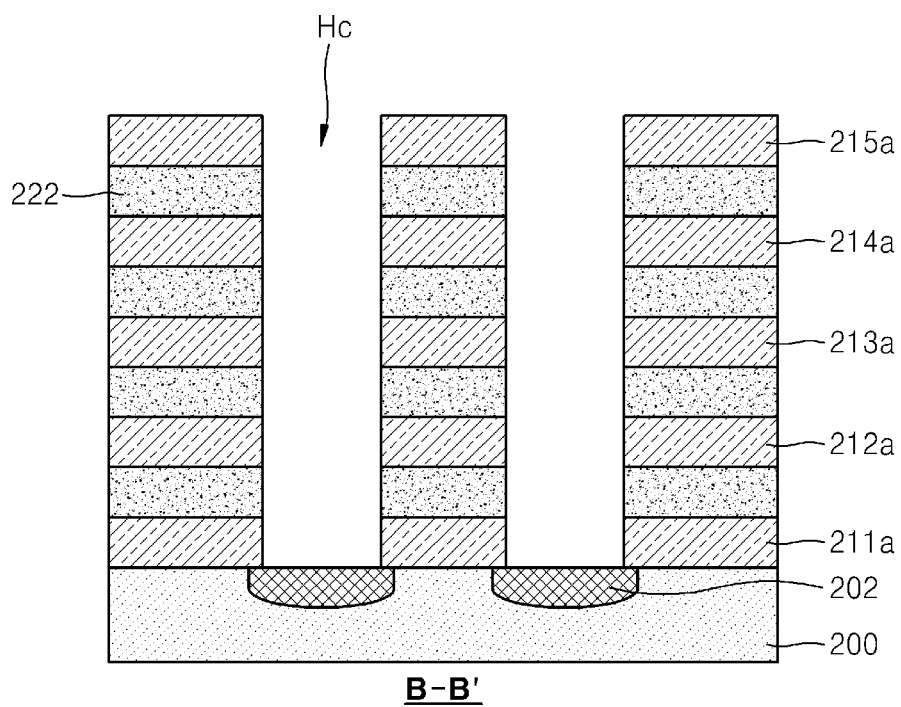

Referring to FIGS. 19A and 19B, a plurality of holes $H_C$ are formed by etching the interlayer insulating layers 211a through 215a and the sacrificial layer 222 to expose the impurity regions 202. The plurality of holes $H_C$ may be arranged as a matrix in which the holes $H_C$ are spaced by constant intervals in the x and y directions.

The plurality of holes $H_C$ may be have various vertical profiles, for example, each hole may have a trapezoidal shape in cross section in a plane perpendicular to the x and y directions and wherein an upper portion of the hole is wider than a lower portion thereof; however, the holes $H_C$ are shown in the FIG. 19B as having upper and lower portions that have the same widths for ease of illustration.

In addition, each of the holes $H_C$ at this time may have a circular cross section with respect to the z direction.

Figure 20A:
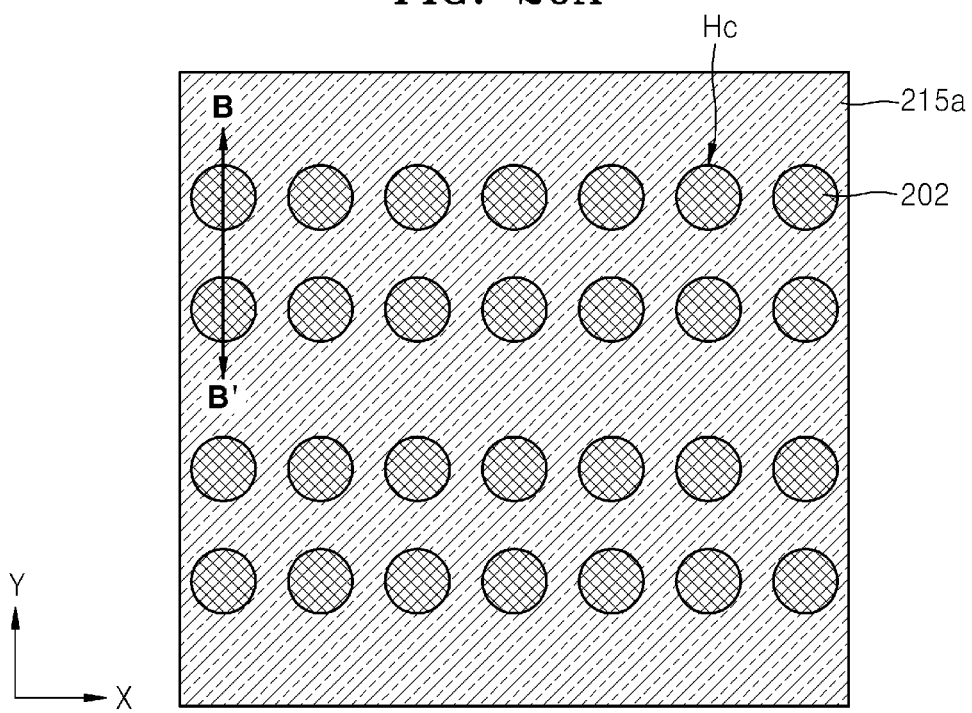
Figure 20B:
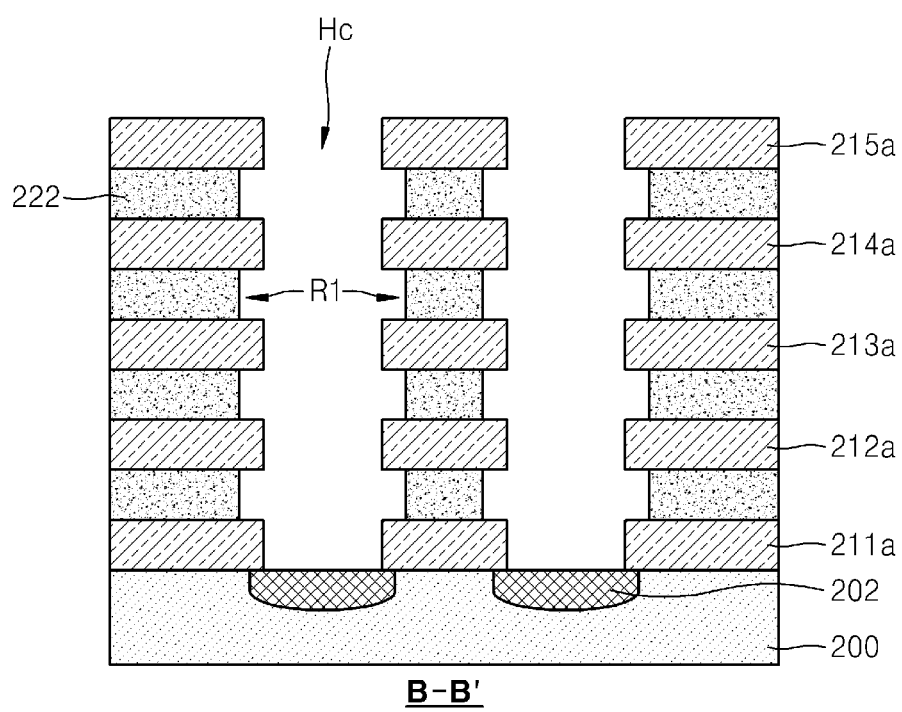

However, and with reference to FIGS. 20A and 20B, the sacrificial layer 222 exposed at inner side surfaces of the plurality of holes $H_C$ is etched in the x and y directions to form recesses R1.

Figure 21A:
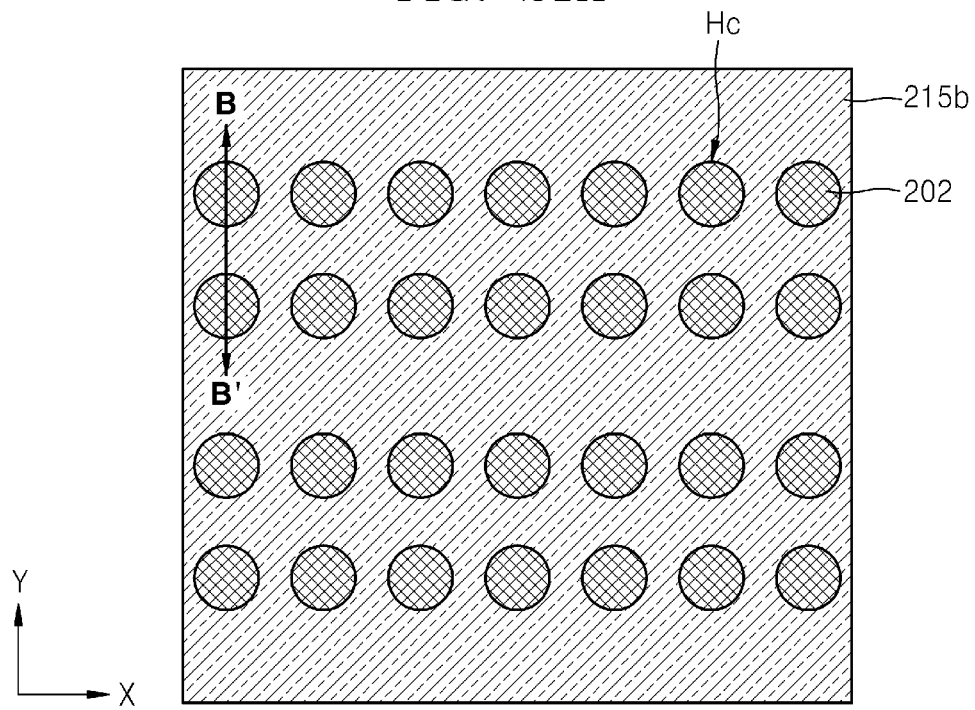
Figure 21B:
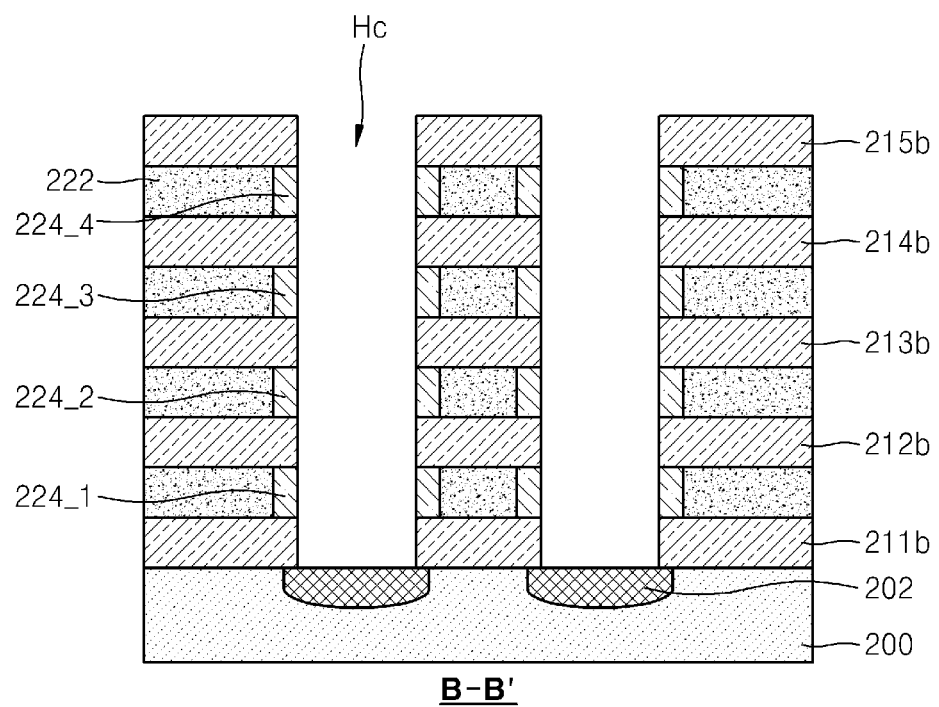

Referring to FIGS. 21A and 21B, the plurality of holes $H_C$ and the recesses R1 are filled with a conductive material, for example, polysilicon or a metal material such as TiN, W, or Pt.

In addition, holes $H_C$ are formed again by an etching process so as to form the annular fourth conductive layer patterns 224_1 through 224_4, and the interlayer insulating layers 211b through 215b.

Figure 22A:
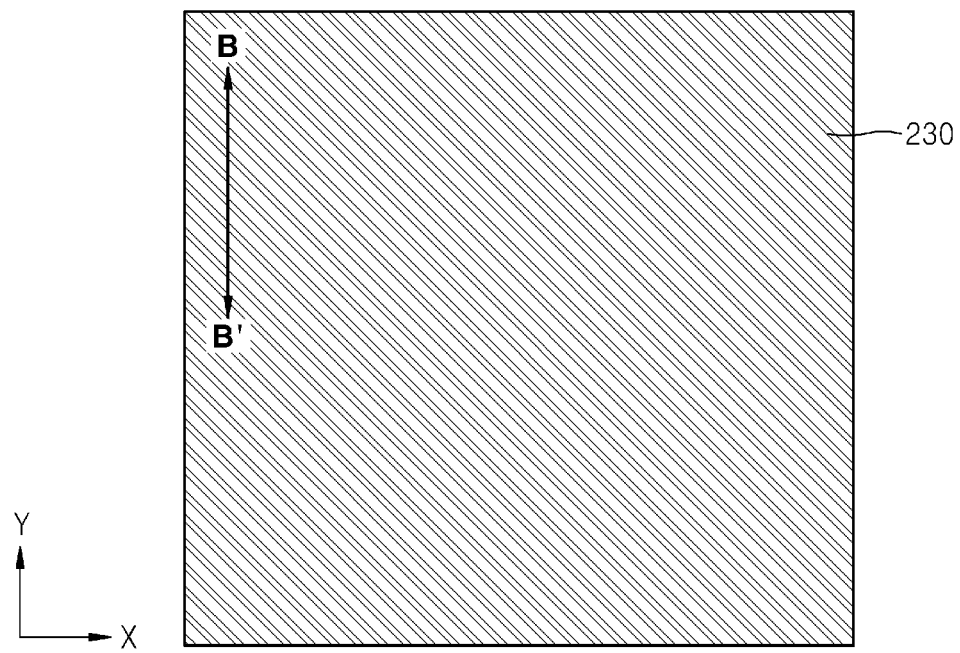
Figure 22B:
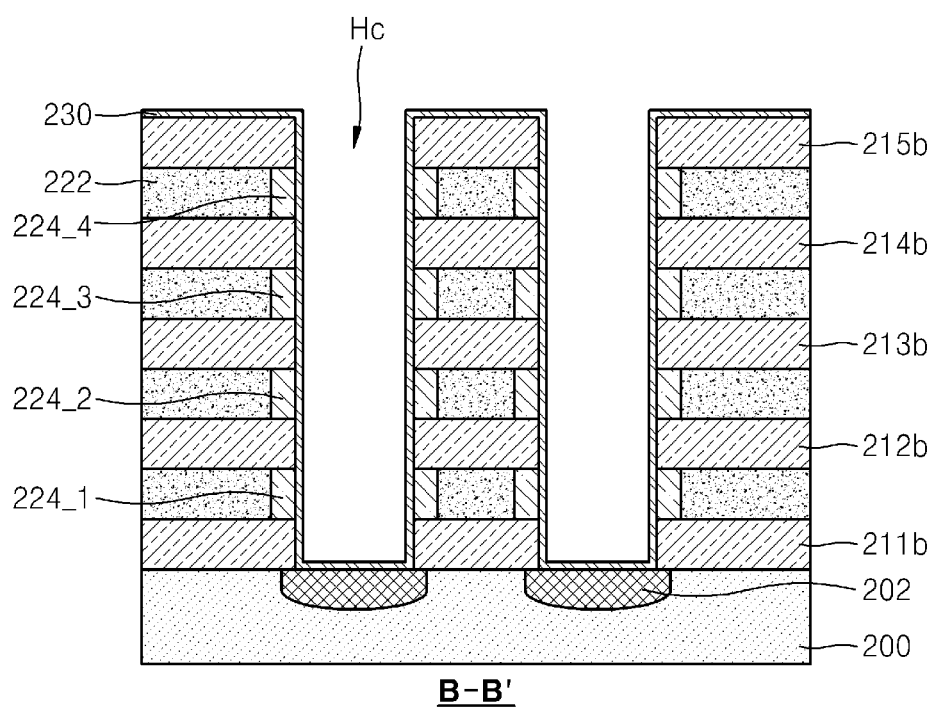

Referring to FIGS. 22A and 22B, the semiconductor layer 230 is formed to a predetermined thickness to cover the impurity regions 202 and the interlayer insulating layers 211b through 215b that are exposed through the plurality of holes $H_C$.

The semiconductor layer 230 may include at least one of, for example, single crystalline silicon or polysilicon, and germanium. Also, the semiconductor layer 230 may be doped with p-type or n-type impurities.

Figure 23A:
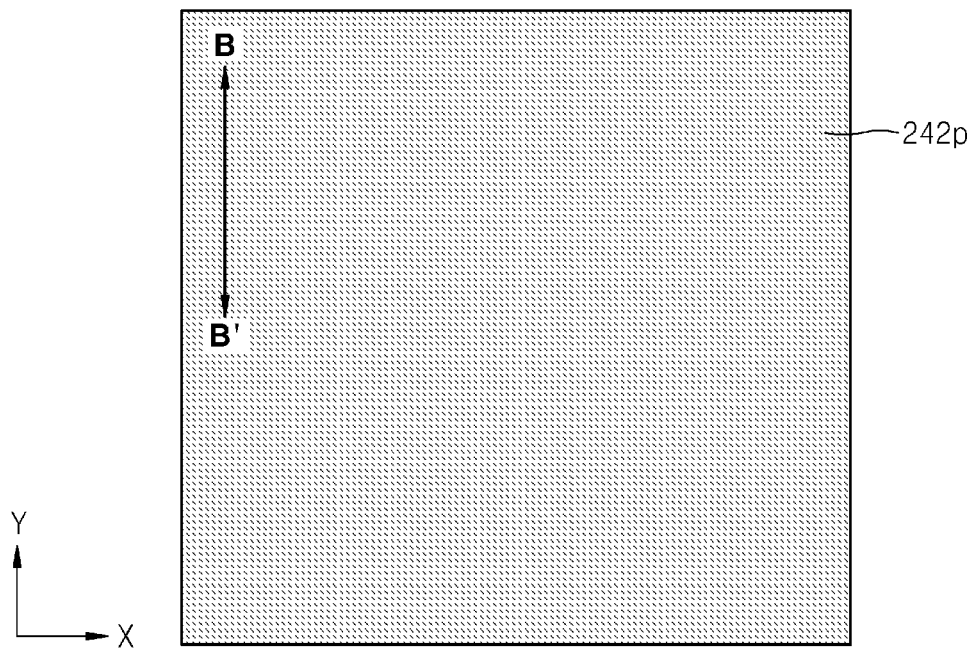
Figure 23B:
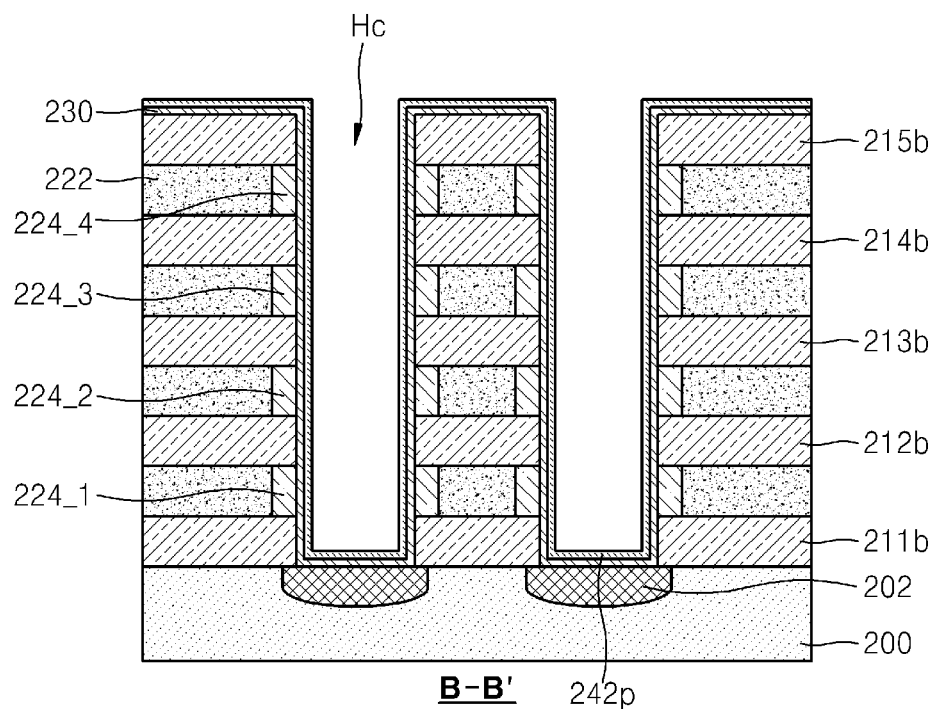

Referring to FIGS. 23A and 23B, a preliminary insulating layer 242p is formed on the semiconductor layer 230 to a predetermined thickness.

The preliminary insulating layer 242p may include at least one of a silicon oxide layer, a silicon nitride layer, a silicon oxynitride layer, an ONO layer, and a high-k dielectric film having a dielectric constant that is greater than that of silicon oxide.

Figure 24A:
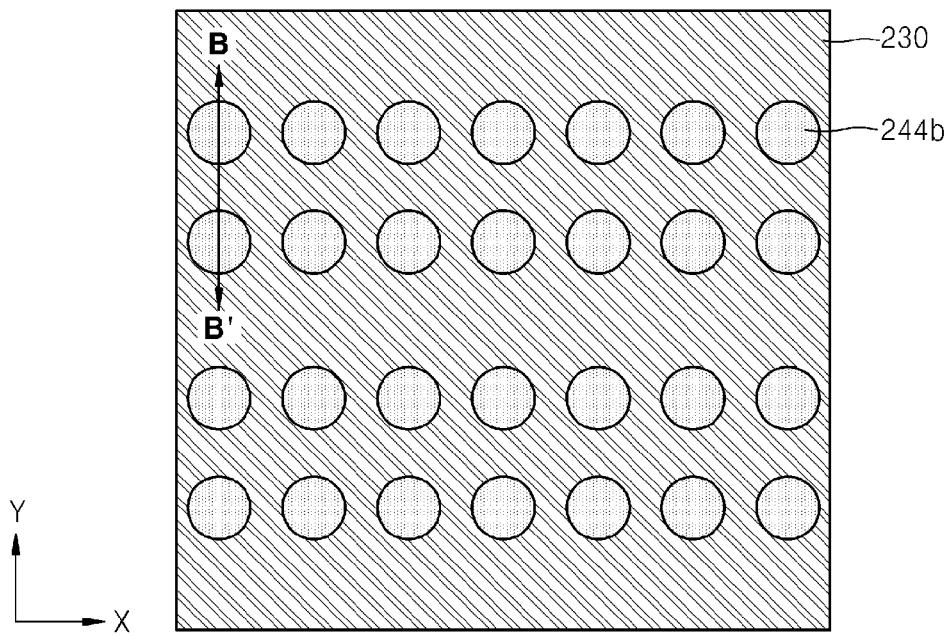
Figure 24B:
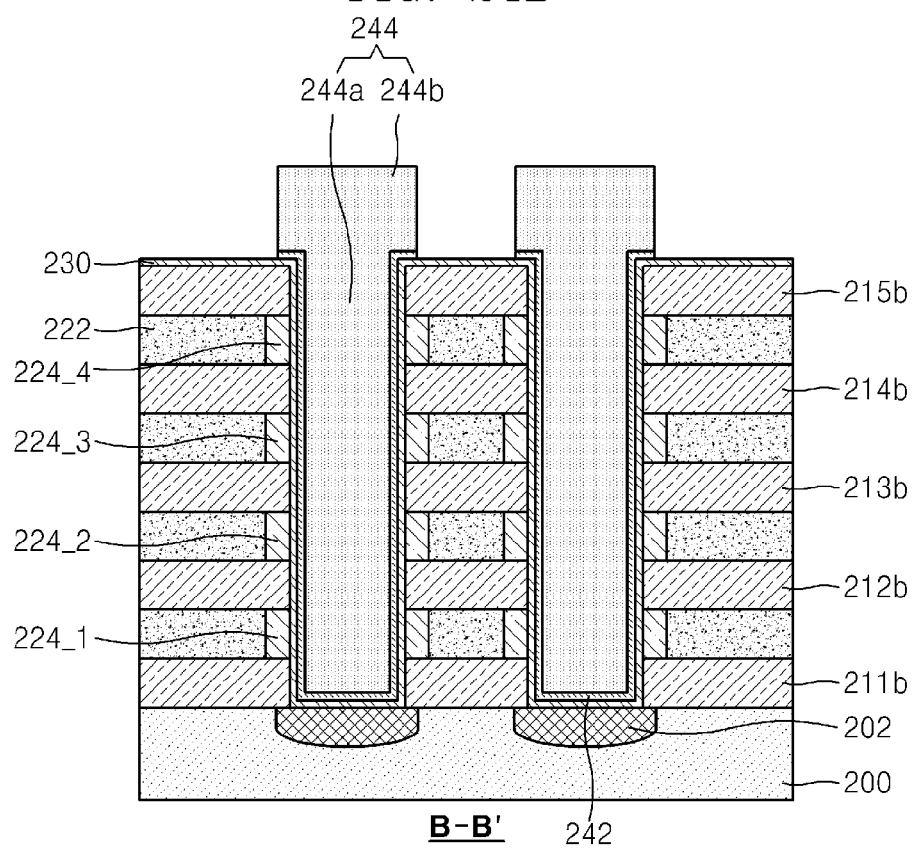

Referring to FIGS. 24A and 24B, a conductive material layer is formed to cover the preliminary insulating layer 242p on the upper surface of the uppermost interlayer insulating layer 215b to a predetermined thickness and fill the plurality of holes $H_C$. The conductive material layer may be formed of, for example, polysilicon or a metal material such as TiN, W, or Pt.

In addition, the conductive material layer is patterned through a photolithography process and an etching process to form the third pillars 244. More specifically, a mask pattern having a width that is greater than the horizontal cross section of the plurality of holes $H_C$ is formed on the conductive material layer, and the conductive material layer and the preliminary insulating layer 242p are removed by an etching process in which the mask pattern is used as an etching mask.

Accordingly, the third pillars 244 are formed to have the first portions 244a filling the plurality of holes $H_C$ and the second portion 244b protruding from the semiconductor layer 230, the semiconductor layer 230 that was covering the uppermost interlayer insulating layer pattern 215 is exposed, and an insulating layer 242 is formed to cover the lower and side surfaces of the first portions 244a and parts of the lower surfaces of the second portions 244b in the third pillars 244.

The second portions 244b of the third pillars 244 may function as contact pads for preventing defective contact when electrically connecting to the first wiring layer 296 (see FIGS. 30A and 30B) that is subsequently formed.

In addition, the cross section of the second portion 244b may be circular shape, the present inventive concept is not limited thereto.

Figure 25A:
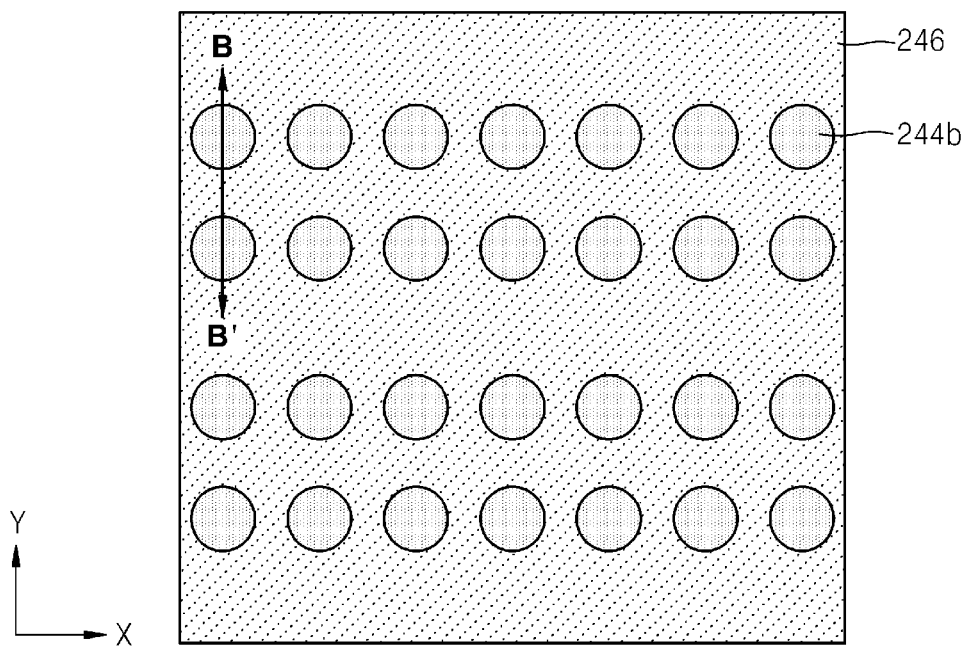
Figure 25B:
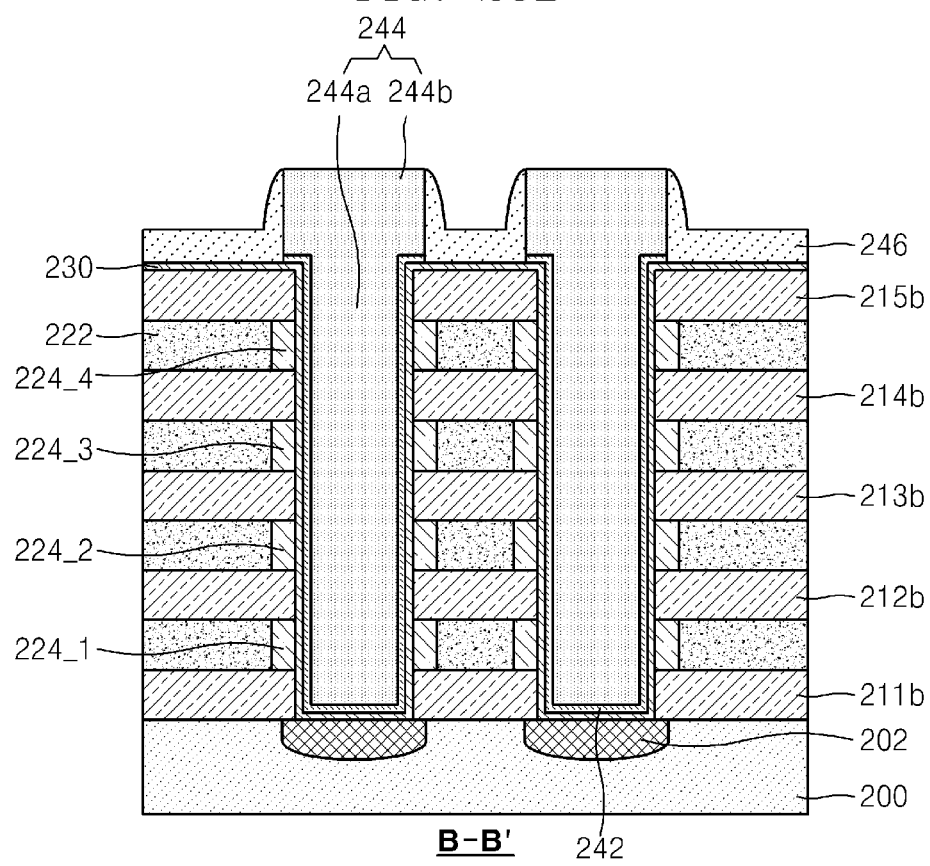

Referring to FIGS. 25A and 25B, the protective layer 246 is formed to cover the semiconductor layer 230, surround side walls of the second portions 244b in the third pillars 244, and expose the upper surfaces of the second portions 244b in the third pillars 244.

Figure 26A:
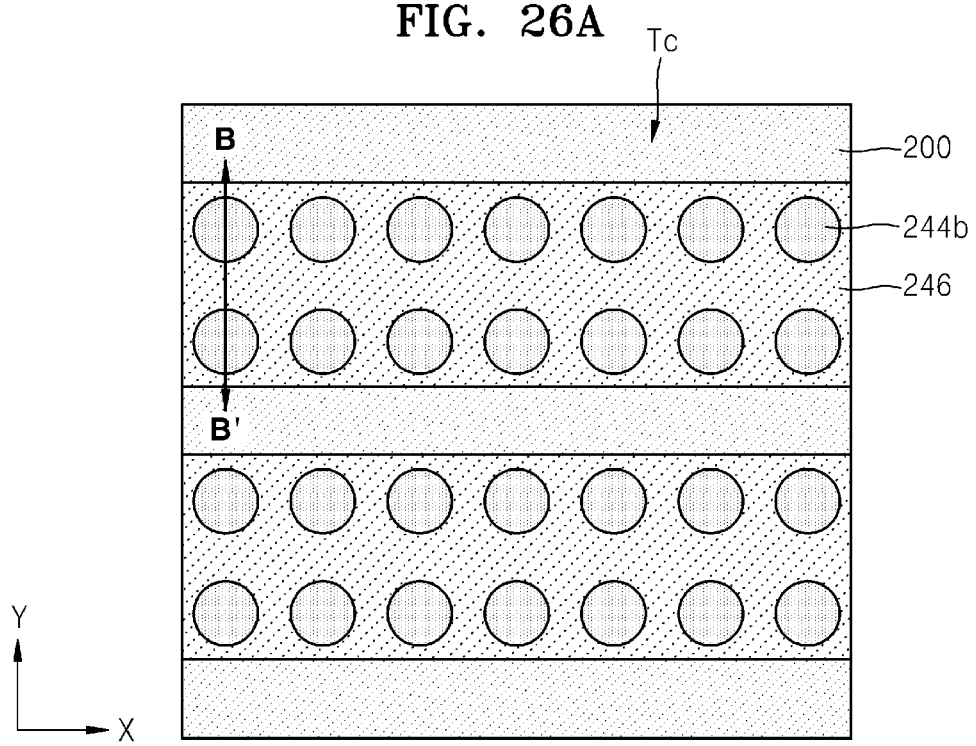
Figure 26B:
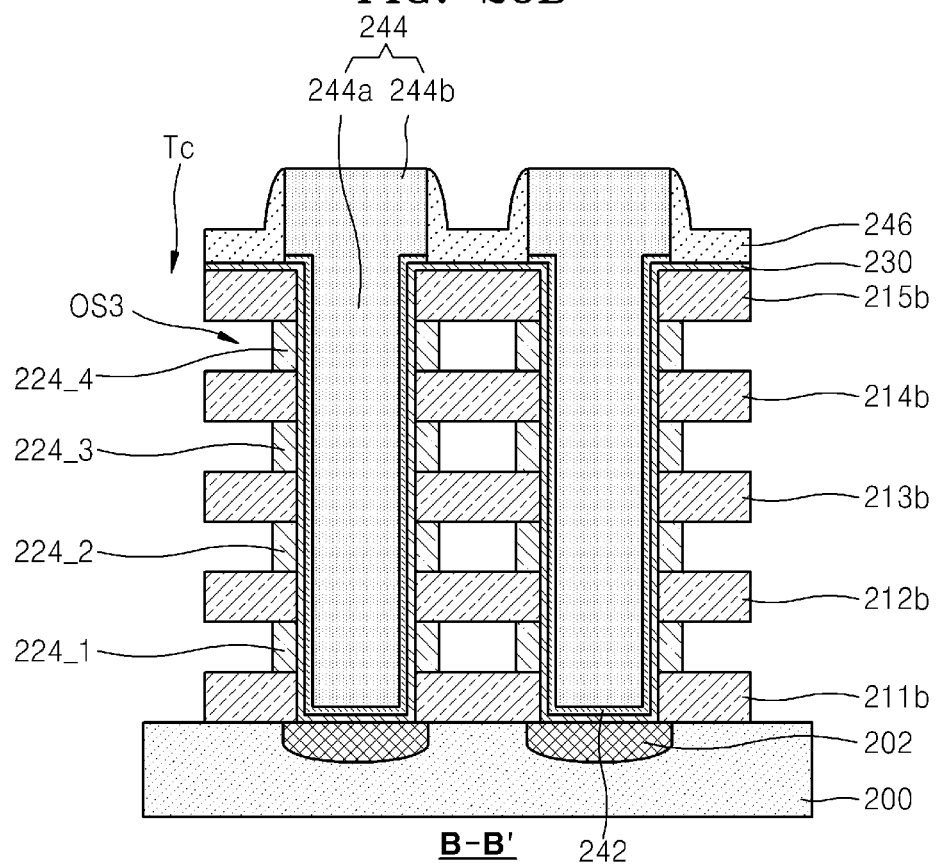

Referring to FIGS. 26A and 26B, the interlayer insulating layers 211b through 215b and the sacrificial layer 222 are etched to form trenches $T_C$ in the form of lines extending in the x directions and expose the main surface of the substrate 200, the side surface of the sacrificial layer 222, and the interlayer insulating layers 211b through 215b.

In addition, more of the sacrificial layer 222 is removed through an etching process to form slits OS3 that expose the fourth conductive layer patterns 224_1 through 224_4 between the interlayer insulating layers 211b and 212b, between the interlayer insulating layers 212b and 213b, between the interlayer insulating layers 213b and 214b, and between the interlayer insulating layers 214b and 215b.

Figure 27A:
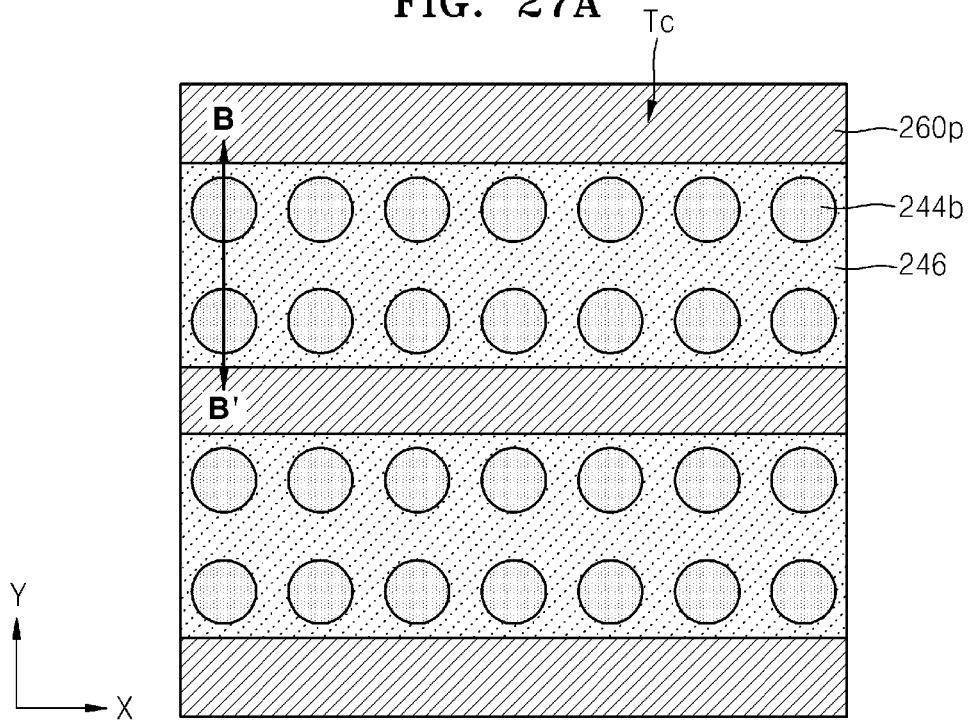
Figure 27B:
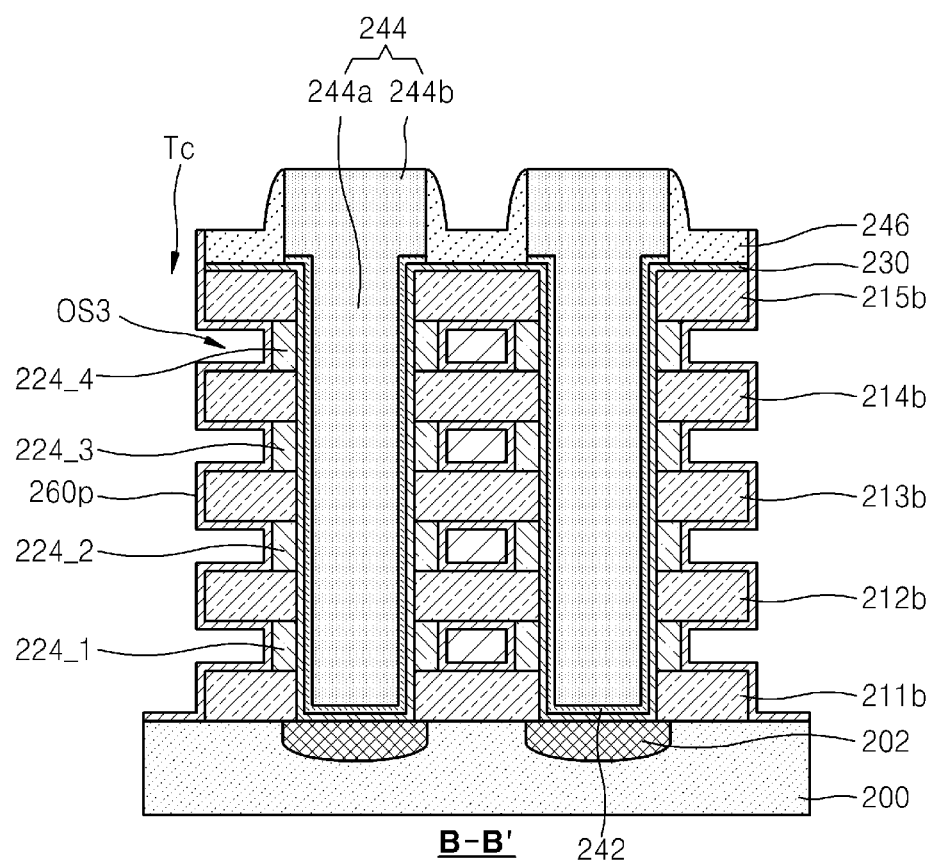

Referring to FIGS. 27A and 27B, a preliminary variable resistance layer 260p is formed to cover the main surface of the substrate 200, the exposed surfaces of the interlayer insulating layers 211b through 215b, and the side surfaces of the fourth conductive layers 224_1 and 224_4 that are exposed through the trenches $T_C$ and the slits OS3.

Figure 28A:
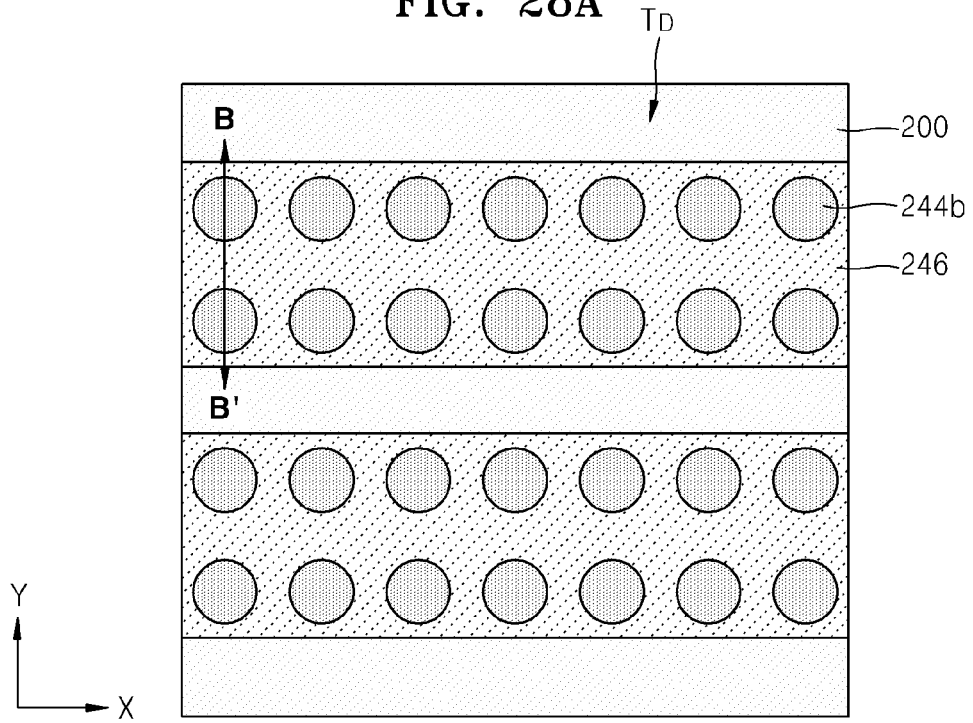
Figure 28B:
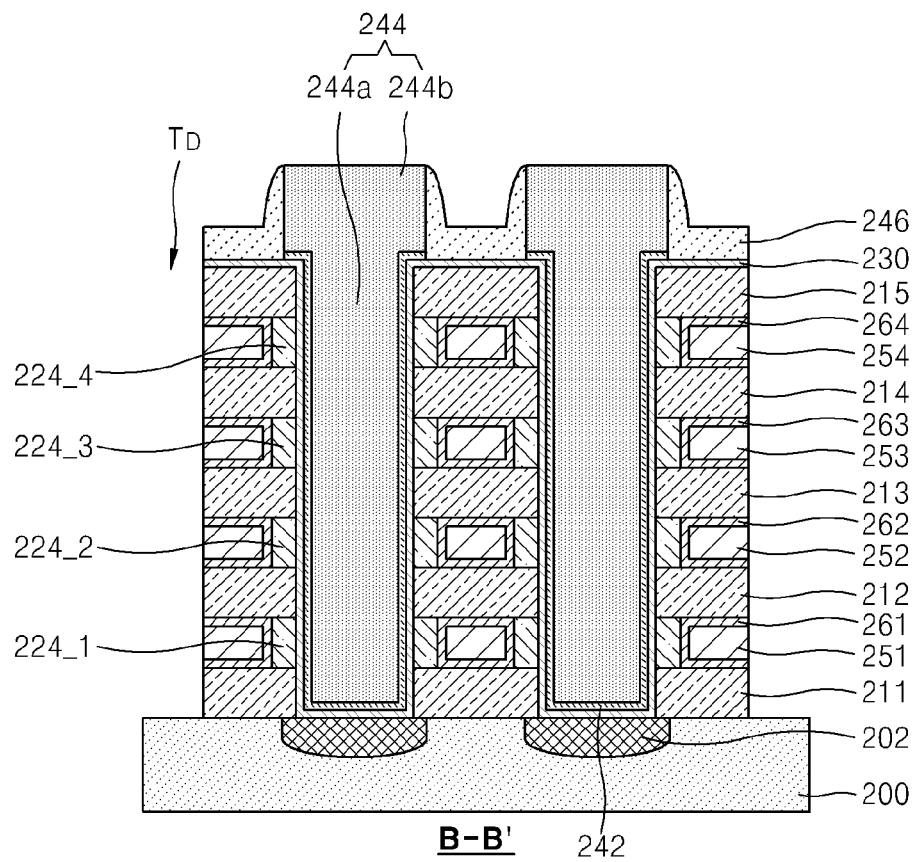

Referring to FIGS. 28A and 28B, the trenches $T_C$ (see FIG. 27B) and the slits OS3 (see FIG. 27B) are filled with a conductive material. The conductive material may include, for example, polysilicon or a metal material such as TiN, W, or Pt.

In addition, trenches $T_D$ are formed as lines extending in the x directions. As such, third conductive layer patterns 251 through 254, each of which is divided by two columns of the third pillars 244, are formed. Also, variable resistance layers 261 through 264 are disposed between the side surfaces of the third conductive layer patterns 251 through 254 and the fourth conductive layer patterns 224_1 through 224_4 to cover upper and bottom surfaces of the third conductive layer patterns 251 through 254. In addition, the interlayer insulating layer patterns 211 through 215 are formed from the interlayer insulating layers 211b through 215b, respectively.

Figure 29A:
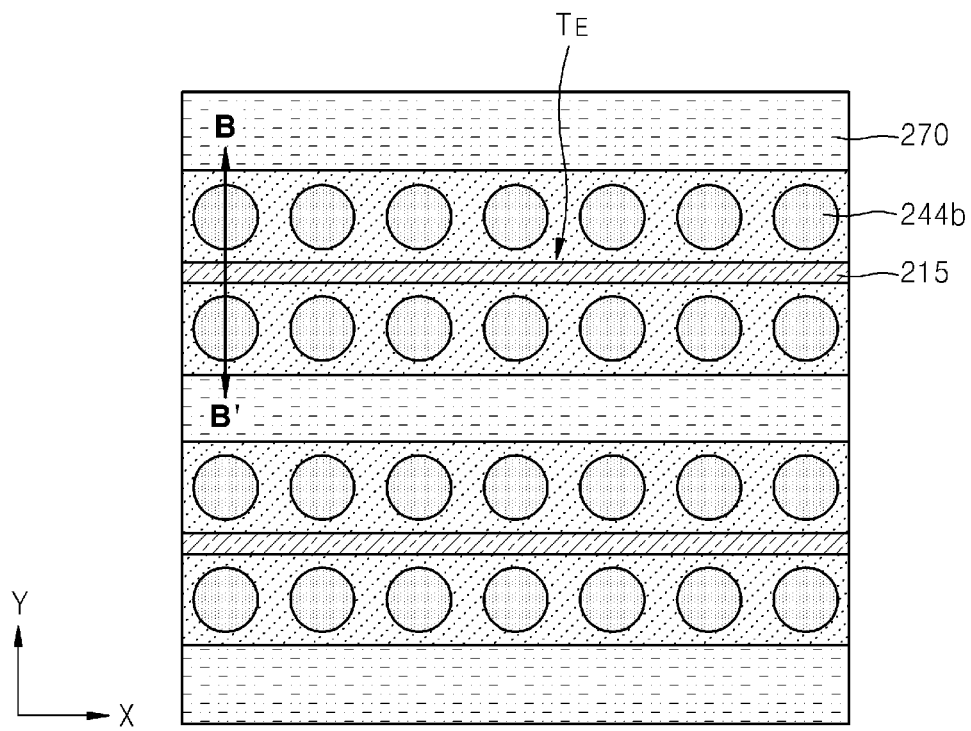
Figure 29B:
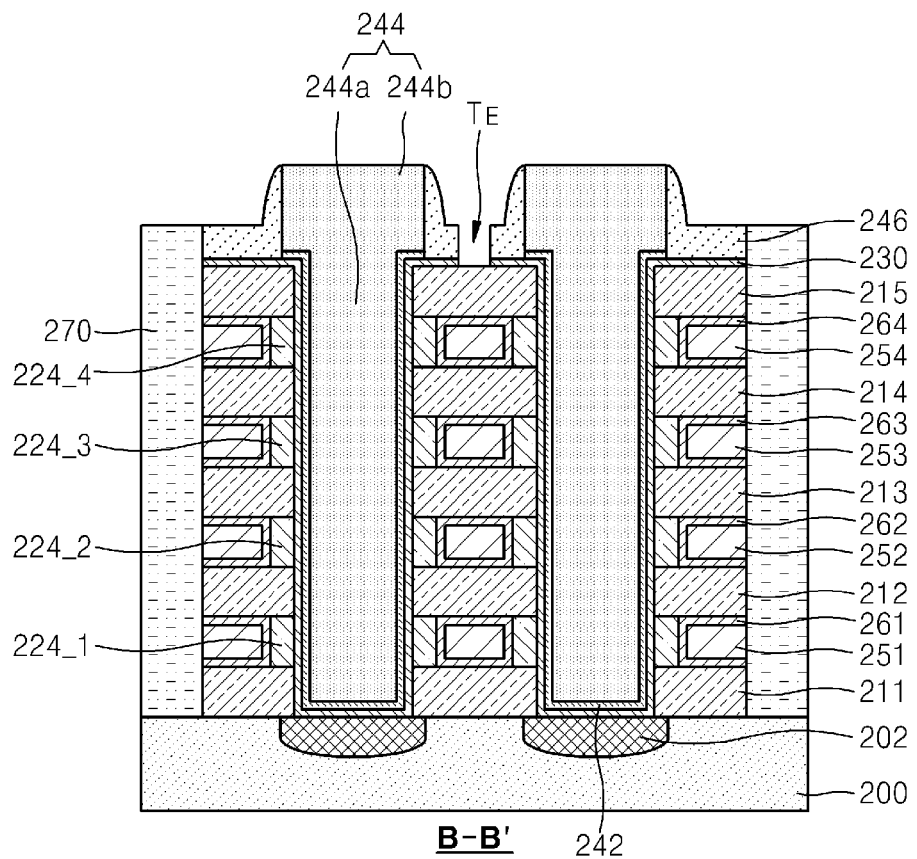

Referring to FIGS. 29A and 29B, the trenches $T_D$ (see FIG. 28B) are filled with an insulating material and the resulting structure is planarized to form insulating regions 270. The insulating material may include an oxide layer, a nitride layer, an oxynitride layer, or a combination thereof.

Next, trenches $T_E$ formed as lines extending in the x direction are formed by removing the parts of the protective layer 246 and the semiconductor layer 230 between the adjacent third pillars 244. As such, the source/drain between the third pillars 244 that are adjacent in the y direction may be isolated.

Figure 30A:
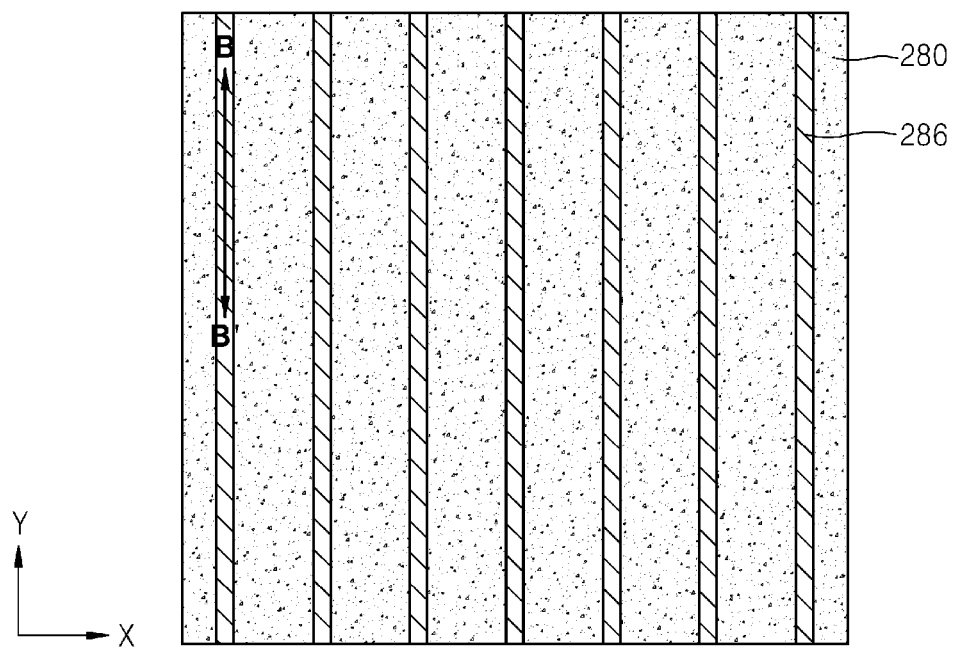
Figure 30B:
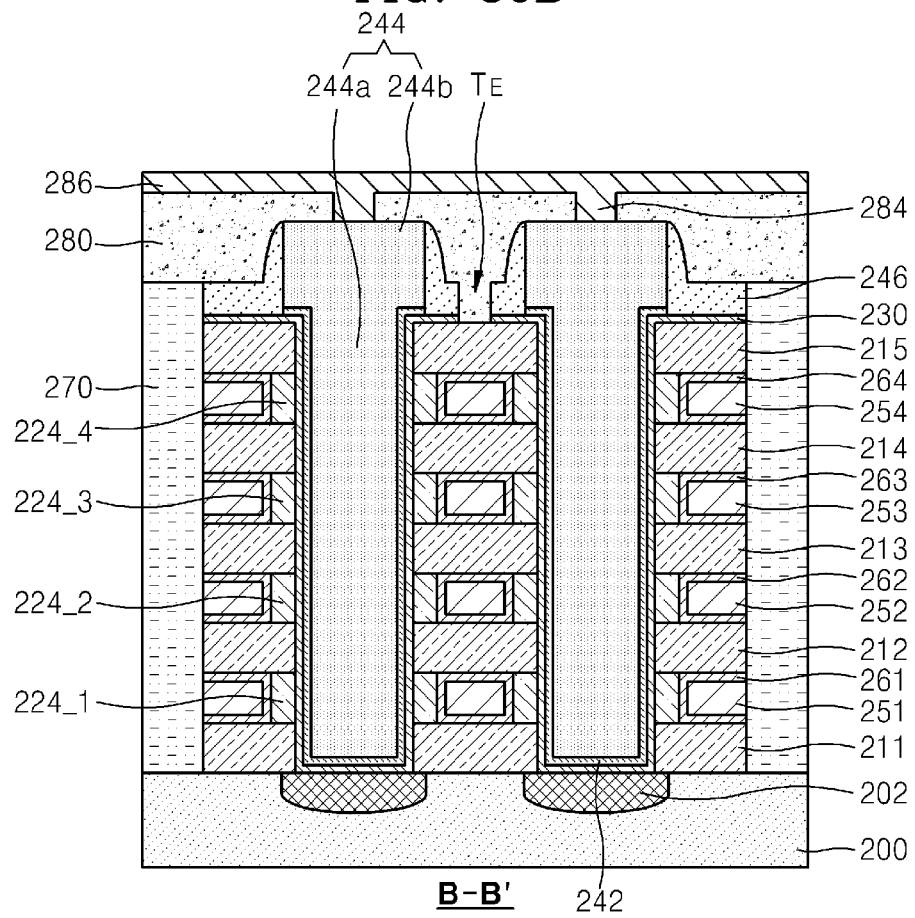

Referring to FIGS. 30A and 30B, the insulating layer 280 between first wires is formed to cover the upper surfaces of the second portions 244b in the third pillars 244, the protective layer 246, and the insulating regions 270, and to fill in the trenches $T_E$. The insulating layer 280 between first wires may be formed of an oxide layer or a nitride layer.

The contact plugs 284 are formed through the insulating layer 280 between first wires to connect to the second portions 244b of the third pillars 244, and the first wiring layer 286 is formed by a patterning process to extend in the y direction and connect to the contact plugs 284.

Figure 31A:
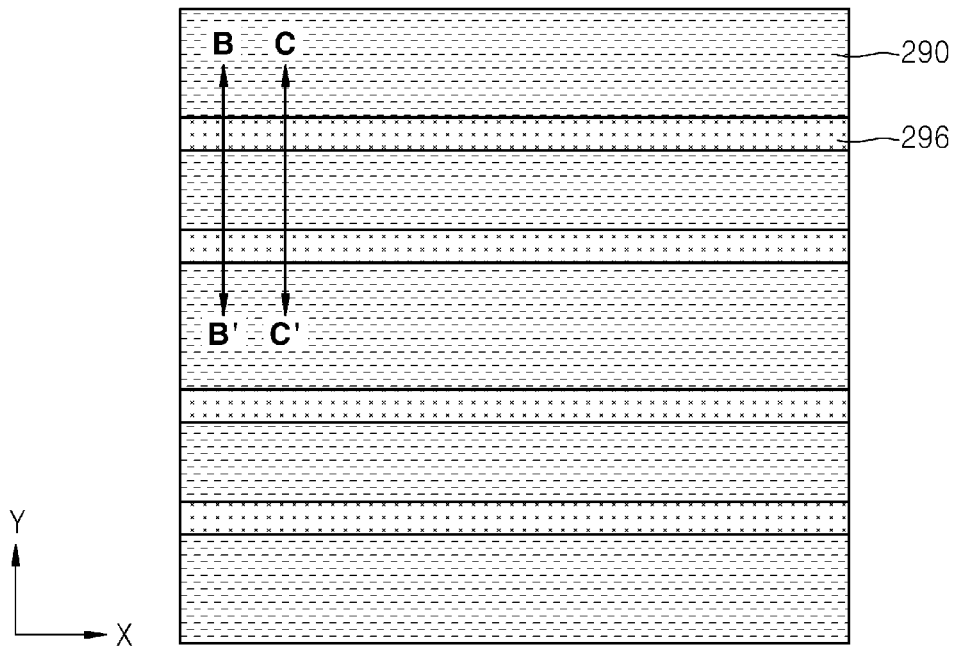
Figure 31B:
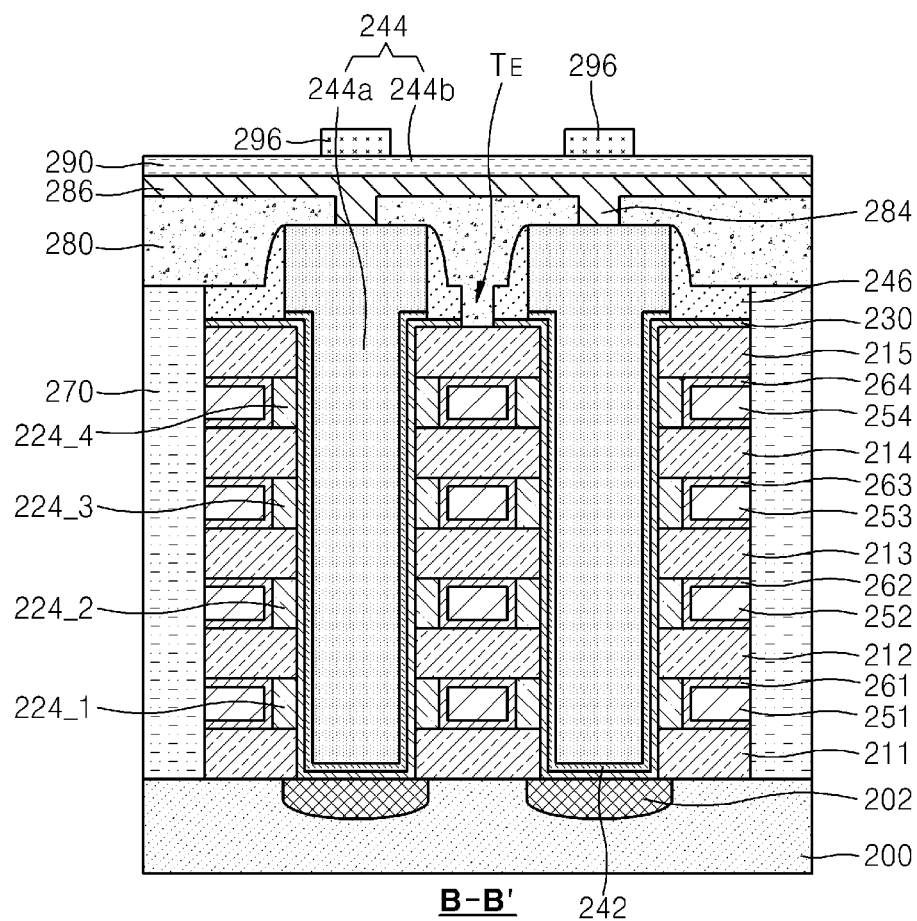
Figure 31C:
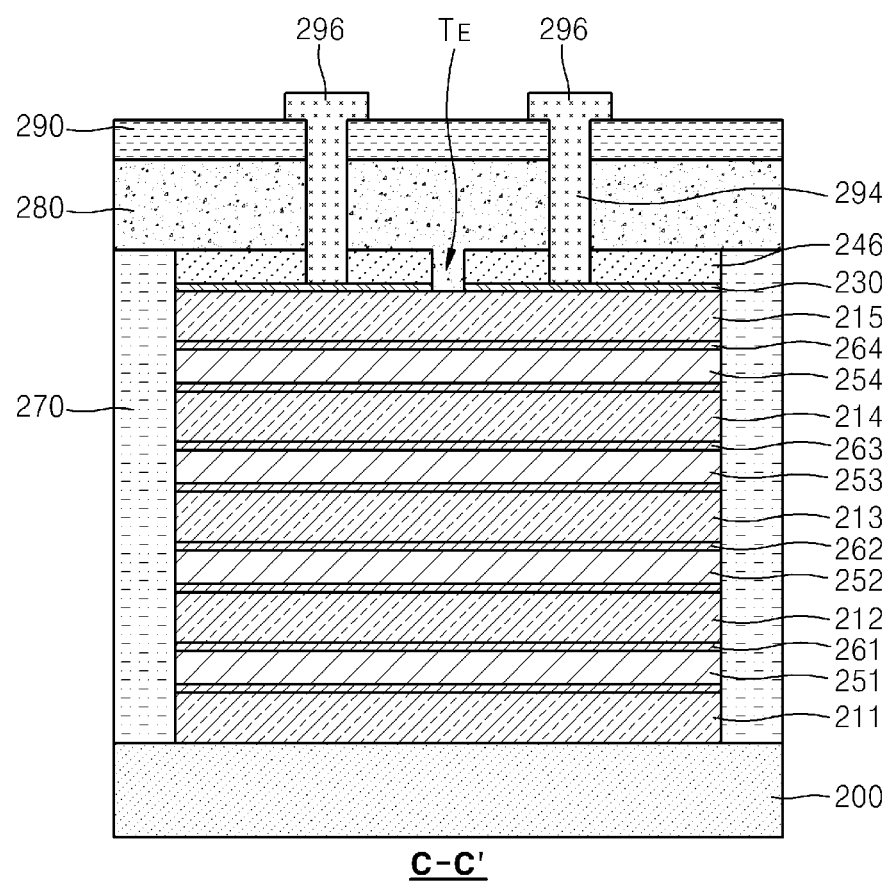

Referring to FIGS. 31A through 31C, the insulating layer 290 between second wires is formed to cover the first wiring layer 286. The insulating layer 290 between second wires may be formed of an oxide layer or a nitride layer.

Next, the contact plugs 294 are formed to penetrate through the protective layer 246, the insulating layer 280 between first wires, and the insulating layer 290 between second wires to be connected to the semiconductor layer 230 between the second portions 244b of the third pillars 244 that are adjacent in the x direction. In addition, the second wiring layer 296 is formed on the insulating layer 290 between second wires to extend in the y direction and connect to the contact plugs 294.

Figure 32:
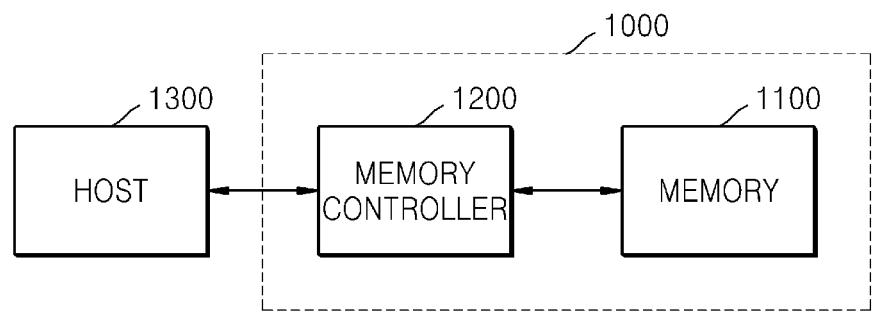
FIG. 32 is a schematic block diagram of a memory card including a semiconductor memory device according to the present inventive concept.

FIG. 32 is a schematic block diagram of a memory card 1000 including an embodiment of a semiconductor device according to the present inventive concept.

Referring to FIG. 32, the memory card 1000 includes a memory 1100 and a memory controller 1200.

The memory 1100 may store data. According to one embodiment, the memory 1100 is a non-volatile memory that may store the data even when there is no electric power being supplied to the memory. The memory 1100 may include a semiconductor device according to the present inventive concept. That is, the memory 1100 may include the semiconductor memory device 10 or 20 respectively shown in FIGS. 3A through 3C, or FIGS. 17A through 17C.

The memory controller 1200 may read the data stored in the memory 1100 or store the data in the memory 1100 in response to reading/writing requests of a host 1300.

Figure 33:
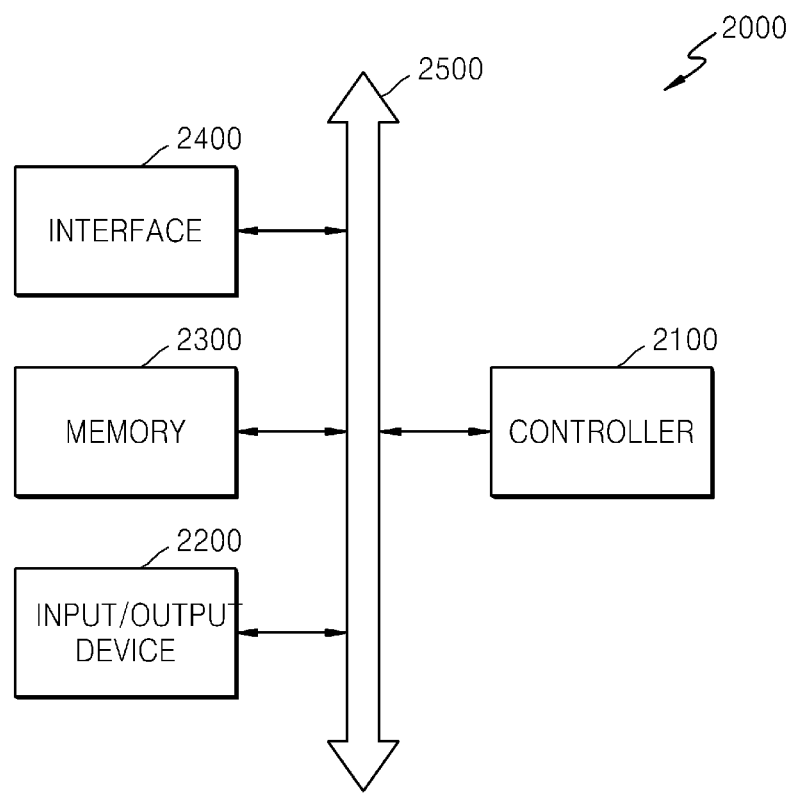
FIG. 33 is a schematic block diagram of a system including a semiconductor memory device according to the present inventive concept.

FIG. 33 is a schematic block diagram of a system 2000 including a semiconductor device according to the present inventive concept.

Referring to FIG. 33, the system 2000 includes a controller 2100, an input/output device 2200, a memory 2300, and an interface 2400. The system 2000 may be a mobile system or another type of system for transmitting/receiving information. Examples of such a mobile system include a personal digital assistant (PDA), a portable computer, a web tablet, a wireless phone, a mobile phone, a digital music player, and a memory card.

The controller 2100 controls an execution program in the system 2000, and may include a microprocessor, a digital signal processor, a microcontroller, or a similar device. The input/output device 2200 may input or output data into/from the system 2000. The system 2000 may be connected to an external device, for example, a personal computer, or a network via the input/output device 2200, and may exchange data with the external device. The input/output device 2200 may be a keypad, a keyboard, or a display.

The memory 2300 may store code for operating the controller 2100 and/or data, or may store data processed by the controller 2100. The memory 2300 may include a semiconductor device according to the present inventive concept. That is, the memory 2300 may include the semiconductor memory device 10 or 20 shown in FIGS. 3A through 3C, or FIGS. 17A through 17C.

The interface 2400 may provide a data transfer path between the system 2000 and an external device. The controller 2100, the input/output device 2200, the memory 2300, and the interface 2400 may communicate with each other via a bus 2500. The system 2000 may be used in a mobile phone, an MP3 player, a navigation system, a portable multimedia player (PMP), a solid state drive (SSD), or household appliances.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor memory device comprising:
a substrate;
first pillars extending upright on the substrate in a direction perpendicular to a major surface of the substrate;
a first interlayer insulating layer pattern, a first conductive layer pattern, a second interlayer insulating layer pattern, and a second conductive layer pattern disposed on the substrate in a stack, wherein the stack extends vertically alongside the first pillars;
a variable resistance layer interposed between the first pillars and the first conductive layer pattern; and
an insulating layer interposed between the first pillars and the second conductive layer pattern.

2. The semiconductor memory device of claim 1, further comprising second pillars of conductive material disposed on the substrate as spaced from the first pillars.

3. The semiconductor memory device of claim 2, wherein the second pillars each have a body extending upright, on the substrate, in the direction perpendicular to said major surface of the substrate,
the second pillars have protrusions that protrude from the bodies, in directions parallel to said major surface, including toward the first pillars, and
said second conductive layer pattern is constituted by the protrusions of the second pillars.

4. The semiconductor memory device of claim 2, wherein the insulating layer is interposed between the first conductive layer pattern and the second pillars.

5. The semiconductor memory device of claim 1, wherein the variable resistance layer extends to an upper surface and a lower surface of the first conductive layer pattern.

6. The semiconductor memory device of claim 1, wherein the insulating layer extends to an upper surface and a lower surface of the second conductive layer pattern.

7. The semiconductor memory device of claim 1, further comprising a residual sacrificial layer pattern contacting the first pillars and interposed between the first interlayer insulating layer pattern and the second interlayer insulating layer pattern in said stack.

8. The semiconductor memory device of claim 7, wherein the residual sacrificial layer pattern is located in said stack at the same level or levels, in the direction perpendicular to said major surface of the substrate, as the second conductive layer pattern.

9. The semiconductor memory device of claim 1, further comprising impurity regions in the substrate, the impurity regions contacting lower surfaces of the first pillars and defining junction diodes with the substrate.

10. A semiconductor memory device comprising:
a substrate;
pillars extending upright on the substrate in a direction perpendicular to a major surface of the substrate;
an insulating layer extending along the sides of the pillars;
a semiconductor layer on the insulating layer;
an interlayer insulating layer pattern and a first conductive layer pattern disposed in a stack on the substrate, wherein the stack extends vertically alongside the pillars;
a second conductive layer pattern interposed between the pillars and the first conductive layer pattern; and
a variable resistance layer interposed between the first conductive layer pattern and the second conductive layer pattern.

11. The semiconductor memory device of claim 10, wherein the second conductive layer pattern has annular sections each of which surrounds one of the pillars.

12. The semiconductor memory device of claim 10, wherein the variable resistance layer extends to an upper surface and a lower surface of the first conductive layer pattern.

13. The semiconductor memory device of claim 10, wherein the insulating layer extends to a lower surface of each of the pillars and to an uppermost surface of the interlayer insulating layer pattern.

14. The semiconductor memory device of claim 10, wherein the semiconductor layer extends to the uppermost surface of the interlayer insulating layer pattern.

15. The semiconductor memory device of claim 10, wherein each of the pillars has a first portion extending through the interlayer insulating layer pattern and the first conductive layer pattern, and a second portion protruding upwardly beyond the interlayer insulating layer pattern, and a width of the second portion is greater than a width of the first portion in a direction parallel to said major surface of the substrate.

16. A semiconductor memory device comprising:
- a first word line;
- a first local bit line including a first transistor and a second transistor that are connected to each other in series;
- a first virtual bit line connecting gates of the first transistor and the second transistor; and
- a first variable resistance memory cell connected in the device between the first word line and a common node where the first transistor and the second transistor are connected to each other in series.

17. The semiconductor memory device of claim 16, further comprising:
- a second local bit line including a third transistor and a fourth transistor connected to each other in series;
- a second virtual bit line connecting gates of the third transistor and the fourth transistor; and
- a second variable resistance memory cell connected in the device between the first word line and a common node where the third and fourth transistors are connected in series to each other.

18. The semiconductor memory device of claim 17, further comprising a global local bit line connecting the first local bit line and the second local bit line to each other.

19. The semiconductor memory device of claim 17, further comprising a global virtual bit line connecting the first virtual bit line and the second virtual bit line to each other.

20. The semiconductor memory device of claim 16, wherein the first word line extends on a substrate in a horizontal direction, and the first local bit line and the first virtual bit line extend on the substrate in a vertical direction.

* * * * *